United States Patent [19]
Sanada

[11] Patent Number: 5,944,847
[45] Date of Patent: Aug. 31, 1999

[54] METHOD AND SYSTEM FOR IDENTIFYING FAILURE POINT

[75] Inventor: Masaru Sanada, Tokyo, Japan

[73] Assignee: Tokyo, Japan, Tokyo, Japan

[21] Appl. No.: 08/902,209

[22] Filed: Jul. 29, 1997

[30] Foreign Application Priority Data

Jul. 29, 1996 [JP] Japan ................................. 8-216130

[51] Int. Cl.$^6$ ................................................. G01R 31/28
[52] U.S. Cl. ..................... 714/741; 395/500.34
[58] Field of Search .................. 371/27–4, 22.1, 371/22.6, 27.1, 25.1, 27.5; 395/182.06, 183.01, 183.03, 183.07, 185.01, 500.05, 500.06, 500.34, 500.35; 364/481, 488, 490; 714/1, 2, 5, 25, 30, 721, 723, 733, 741

[56] References Cited

U.S. PATENT DOCUMENTS

| | | | |
|---|---|---|---|
| 4,769,817 | 9/1988 | Krohn et al. ............................ | 371/23 |
| 5,515,384 | 5/1996 | Horton, III ............................... | 371/22.4 |
| 5,539,652 | 7/1996 | Tegethoff ................................. | 364/490 |
| 5,554,941 | 9/1996 | Kesel ....................................... | 324/765 |
| 5,726,997 | 3/1998 | Teene ....................................... | 371/22.3 |
| 5,790,565 | 8/1998 | Sakaguchi ................................ | 371/27.1 |

OTHER PUBLICATIONS

M. Sanada, "Evaluation and Detection of CMOS–LSI with Abonormal IDDQ", *Microelectro, Reliab.,* vol. 35, No. 3, pp. 619–629, 1995.

*Primary Examiner*—Robert W. Beausoliel, Jr.
*Assistant Examiner*—Nadeem Iqbal
*Attorney, Agent, or Firm*—Sughrue, Mion, Zinn, Macpeak & Seas, PLLC

[57] ABSTRACT

A failure point identifying method applicable to various defects and capable of promptly identifying a defect point. An LSI tester 4 sequentially impresses test vectors stored in a test vector file 1 across input terminals of a loaded LSI 5 to measure an Iddq value. A test vector number of a test vector which produced an abnormal Iddq value is delivered to a faulty block extractor 2. The faulty block extractor 2 performs logic simulation to find the input logic of each block of the LSI 5 when each test vector stored in the test vector file 1 is entered to the input terminals of the LSI 5. Moreover, a dump list associating each test vector number with the input logic is prepared from block to block. The faulty block is then identified based on the dump list of each block and the test vector number deliver from the LSI tester.

9 Claims, 27 Drawing Sheets

|  | N01 | N02 | N03 | N04 | N05 | N06 | N07 | N08 | N09 |
|---|---|---|---|---|---|---|---|---|---|
| TEST VECTOR NUMBER | | | | | | | | | |
| 1 | 0 | 0 | 0 | 0 | 0 | 0 | 0 | 0 | 0 |
| 2 | 0 | 1 | 1 | 0 | 0 | 1 | 0 | 0 | 0 |
| 3 | 0 | 1 | 1 | 0 | 0 | 1 | 0 | 0 | 1 |
| ⋮ | ⋮ | ⋮ | ⋮ | ⋮ | ⋮ | ⋮ | ⋮ | ⋮ | ⋮ |
| a | 0 | 1 | 1 | 1 | 0 | 0 | 0 | 0 | 1 |
| ⋮ | ⋮ | ⋮ | ⋮ | ⋮ | ⋮ | ⋮ | ⋮ | ⋮ | ⋮ |
|  | 0 | 1 | 1 | 1 | 0 | 0 | 0 | 0 | 1 |

NORMAL (Iddq VALUE ABNORMAL)

NORMAL

FIG. 11

| TEST VECTOR NUMBER | N01 | N02 | N03 | N04 | N05 | N06 | N07 | N08 | N09 |
|---|---|---|---|---|---|---|---|---|---|
| 1 | 0 | 0 | 0 | 0 | 0 | 0 | 0 | 0 | 0 |
| 2 | 0 | 1 | 1 | 0 | 0 | 1 | 0 | 0 | 0 |
| 3 | 0 | 1 | 1 | 0 | 0 | 1 | 0 | 0 | 1 |
| ... | | | | | | | | | |
| a | 0 | 1 | 1 | 1 | 0 | 0 | 0 | 0 | 1 |
| ... | | | | | | | | | |

Column a: (Iddq VALUE ABNORMAL)

Other columns: NORMAL

FIG. 12

| TEST VECTOR NUMBER | N0 1 | N0 2 | N0 3 | N0 4 | N0 5 |
|---|---|---|---|---|---|
| 1 | 0 | 0 | 0 | 0 | 0 |
| 2 | 0 | 1 | 1 | 0 | 1 |
| 3 | 0 | 1 | 1 | 0 | 0 |
| ⋮ | ⋮ | ⋮ | ⋮ | ⋮ | ⋮ |
| 41 | 0 | 1 | 1 | 1 | 1 |
| 42 | 0 | 1 | 1 | 1 | 0 |
| ⋮ | ⋮ | ⋮ | ⋮ | ⋮ | ⋮ |
| 87 | 0 | 1 | 1 | 1 | 1 |
| 88 | 0 | 1 | 1 | 1 | 0 |
| ⋮ | ⋮ | ⋮ | ⋮ | ⋮ | ⋮ |
| 96 | 0 | 1 | 1 | 1 | 0 |

NORMAL (Iddq VALUE ABNORMAL)

NORMAL

FIG. 18

| TEST VECTOR NUMBER | N01 | N02 | N03 | N04 | N05 (Iddq VALUE ABNORMAL) | N05 |
|---|---|---|---|---|---|---|
| 1 | 0 | 0 | 0 | 0 | 0 | 0 |
| 2 | 0 | 0 | 1 | 1 | 1 | 1 |
| 3 | 0 | 1 | 1 | 1 | 1 | 1 |
| ⋮ | ⋮ | ⋮ | ⋮ | ⋮ | ⋮ | ⋮ |
| 41 | 0 | 0 | 1 | 1 | 1 | 0 |
| 42 | 0 | 1 | 1 | 1 | 0 | 0 |
| ⋮ | ⋮ | ⋮ | ⋮ | ⋮ | ⋮ | ⋮ |
| 87 | 0 | 1 | 1 | 0 | 0 | 0 |
| 88 | 0 | 1 | 1 | 1 | 0 | 0 |
| ⋮ | ⋮ | ⋮ | ⋮ | ⋮ | ⋮ | ⋮ |

NORMAL — (Iddq VALUE ABNORMAL) — NORMAL

FIG. 19

| TVno. | D CLK | Q Q* |
|---|---|---|
| 1 | 0 0 | Q Q* |
| 2 | 0 1 | 0 1 |
| 3 | 0 0 | 0 1 |
| 4 | 0 1 | 0 1 |
| 5 | 0 0 | 0 1 |
| 6 | 1 1 | 1 0 |
| 7 | 0 0 | 1 0 |
| 8 | 0 1 | 0 1 |
| 9 | 0 0 | 0 1 |
| 10 | 1 1 | 1 0 |
| 11 | 0 0 | 1 0 |
| 12 | 1 0 | 1 0 |
| 13 | 0 0 | 1 0 |

Rows 6–7 and 10–13: Iddq VALUE ABNORMAL

FIG. 23

| TVno. | IN1 | IN2 | Iddq VALUE |
|-------|-----|-----|------------|
| TV1 | H | H | NORMAL |
| TV2 | H | L | NORMAL |
| TV3 | L | H | ABNORMAL |
| TV4 | L | L | NORMAL |

METHOD AND SYSTEM FOR IDENTIFYING FAILURE POINT

FIELD OF THE INVENTION

This invention relates to a technique of identifying a failure point in a CMOS-LSI and, more particularly, to a method of identifying the failure point by exploiting the supply current in a quiescent state (termed as "quiescent supply current"). The invention particularly relates to a computer-aided system for identifying failure points contained in LSI.

BACKGROUND

Among known methods for identifying the failure point by simulation exploiting CAD, there are a back-tracing method and a failure simulating method by preparation of a failure dictionary.

In the failure simulation method by preparation of a failure dictionary, shown in FIG. 27, simulation is carried out on a normal LSI and for each of defined failure points. If any difference is produced in the results of simulation, the defined points at that time, output terminals where abnormalities occurred at that time, output values of the output terminals and test vectors are associated with one another and registered in the failure dictionary. In specifying the defect points of a defective item, data of the defective item (output terminals where abnormalities occurred, output values and the test vectors) and data for each failure point registered in the failure dictionary (output terminals where the abnormalities occurred, output values and the test vectors) are compared to one another. The failure point registered in association with data coincident with the data of the defective item is inferred to be a failure point.

In the back-tracing method, the failure point is identified by reverse logic tracing from an output terminal to an input terminal based on the output terminal where the abnormalities occurred, an output value and a test vector number. That is, if a pre-set signal is entered at an input terminal of the LSI, and an output signal at an output terminal differs from an expected output value, a signal propagating a failure is extracted from a signal internally propagated from the output terminal to the input terminal by exploiting the difference between the output value and the expected value for inferring the failure point. Then a failure is defined on the inferred failure point and a logical simulation is performed for verifying the coincidence with the actual failure for specifying the failure point. The usual practice is to check a plurality of abnormal output value points and limit pseudo failure signals based on the combination of the abnormal output value points to localize the failure point.

SUMMARY OF THE INVENTION

According to the analysis carried out during the course of the present invention it has turned out that the above-specified conventional technique has the following disadvantages.

The defect simulation method by the preparation of a failure dictionary can handle only single degenerated, i.e., stuck-at defects (Stuck-at-0, Stuck-at-1) as a failure model, whereas it cannot simulate multiple stuck-at failures or open failures. Thus the method is not generic in point of specifying the failure points because the failures handled by the failure simulation are only the modeled logic failures. Moreover, this method is not practically useful in that it has to define failures for all signal lines making up the LSI, thus requiring voluminous data. Usually, the number of defects that need to be defined is proportionate to a third or fourth power of the number of circuit elements making up an LSI.

The back-tracing method uses only the information at the output terminal as data, so that it cannot judge how many failures are occurring in the circuit and hence cannot handle multiple failures. If multiple values have become apparent, it cannot be guessed which output information is associated with the particular failure point based on only the information at the output terminal. Thus, back-tracing results only in detection of voluminous pseudo-defects, while it is totally impossible to identify the failure point.

In addition, the presence of a sequential circuit poses a problem in the back-tracing method. The logical circuits making up the LSI are roughly classified into a sequential circuit and a combination circuit. If a combination circuit connected intermediate between two sequential circuits is regarded as an independent circuit, a signal presumably propagated with back-tracing from an output side to an input side in the independent system can be extracted by simulation to some extent. However, these signals are difficult to extract because it is necessary to take a feedback loop into account in the case of a sequential circuit.

That is, since the sequential circuit is such a circuit in which "the logic of an output at a given time point depends on an input signal applied at some temporally previous time point", a problem is presented if an output of the sequential circuit is fed back to an input of the sequential circuit. Referring to FIG. 28, a signal at a timing (n-1) is entered at an input terminal of the sequential circuit at a timing (n). This signal depends on an output of the sequential circuit itself constituting a feedback loop. In addition, the input signal, in turn, depends on an input signal at (n-2), resulting in a complex situation. Referring to FIG. 28, the signal at timing (n-2) and the signal at timing (n-1) for which an output signal of the sequential circuit itself is fed back to the circuit, are entered at a timing (n) to an input terminal of the sequential circuit. Therefore, if a defect has been detected at the timing (n) in the combination circuit, the state is dependent on a pattern at the timing (n-1) corresponding to the input timing to the sequential circuit and also on the sequential circuit itself preceded by the combination circuit.

The back-tracing verification, focussed on the logic, cannot be put to practical utilization because combination circuits present between the sequential circuits repeat failure propagation a number of times in case where a plurality of combinations of feedback loops are present to render it difficult to trace failure propagation. Thus the back-tracing method is compelled to give up locating failure points or faulty blocks solely by the back-tracing technique and to adopt a method of linking the technique with a physical diagnostic method such as electron beam tester for removing pseudo-defect points from the failure points by acquisition of a non-contrast electron contract image or a logic operating waveform.

It is therefore an object of the present invention to provide a failure point specifying method and system which can be applied for various defects for quickly identifying the failure points.

Other objects of the present invention will become apparent from the entire disclosure.

If a CMOS logic circuit has internal physical damages or defects, the general tendency is that abnormality is produced in the quiescent supply current termed "Iddq (Quiescent Vdd Supply Current)". Therefore, such abnormality in the Iddq value may be deemed to be a signal which renders apparent the physical defect in the inside of the LSI circuit. This is described in M. Sanada, "Evaluation and Detection of CMOS-LSI with Abnormal Iddq" Microelectronics and Reliability, Vol.35, No.3, pp.619 to 629, 1995. The present invention is based on exploitation of these properties.

Usually, an ASIC (Application Specific Integrated Circuits), typified by gate-array items, is realized by constituting a desired electrical circuit by combining circuits constituting fundamental logic termed pre-fabricated "blocks".

The method for identifying the failure point according to the present invention is applied to an LSI designed in accordance with the above-mentioned design system and extracts a faulty block using an input logic in terms of a fundamental logic circuit constituting the LSI, termed a "block", as a unit, which is varied in accordance with the test vector entered from an input terminal of the LSI, and also using a test vector or vectors which produce abnormality in the Iddq value.

For accomplishing the above object, the present invention provides a method for identifying a failure point. The method comprises following steps:

sequentially entering a plurality of test vectors across input terminals of an LSI in a pre-set sequential to detect a test vector producing an abnormality in an Iddq value, finding, by logic simulation, an input logic entered to each block of the LSI when each test vector is sequentially entered to the input terminals of the LSI in the pre-set sequential and judging, for each block, whether or not a defect is contained in the block, by logic processing which is based on an input logic when a test vector which produced an abnormality in the Iddq value is entered and on an input logic when a test vector which produced no abnormality in the Iddq value is entered, to identify the block as containing a defect.

In another aspect of the invention there is provided a computer-aided system for identifying a failure point of LSI comprising:

an LSI tester module loading an LSI to be tested,
a test vector filing memory module,
a faulty block extracting module, and
a defective transistor extracting module,
wherein said faulty block extracting module carries out the steps hereinabove mentioned.

In case where the block is a combination circuit, whether or not the block contains any defect is judged, for instance, as follows. If an input logic coincident with an input logic at the time a test vector (or vectors) which produced abnormality in the Iddq value is (are) entered to an input terminal (terminals) of the LSI is not present in an input logic at the time the test vector(s) which produced no abnormality in the Iddq value is (are) entered to the LSI input terminal (terminals), the block is judged as containing a defect.

In case where the block is a sequential circuit whether or not the block contains any defect is judged, for instance, as follows. If abnormality is produced in plural contiguous test vectors among test vectors sequentially entered in a pre-set sequential, it is judged whether a set of input logics coincident with a set of input logics associated with the contiguous input logics is present in input logics associated with contiguous test vectors not producing abnormalities in the Iddq values. If the set of input logics is not present in the input logic associated with the contiguous test vectors not producing abnormalities in the Iddq values, the block is judged to contain a defect.

For detecting multiple defects, the present invention also provides a method for identifying a failure point comprising following steps:

sequentially entering a plurality of test vectors across input terminals of an LSI in a pre-set sequential to detect a test vector producing an abnormality in an Iddq value, inferring the number of defects based on the test vectors which produced abnormalities in the Iddq values and corresponding Iddq values for finding, from defect to defect, which impressed test vector led to abnormalities in the Iddq value, finding, by logic simulation, an input logic entered to each block constituting the LSI when each test vector is sequentially entered to the input terminals of the LSI in the pre-set sequential and judging, for each block, from defect to defect, whether or not a defect is contained in the block, by logic processing which is based on the input logic when a test vector which produced an abnormality in the Iddq value is entered and on the input logic when a test vector which produced no abnormality in the Iddq value is entered, to identify the block as containing a defect.

In a further aspect of the invention there is provided a computer-aided system for identifying a failure point of LSI comprising:

an LSI tester module loading an LSI to be tested,
a test vector filing memory module,
a faulty block extracting module, and
a defective transistor extracting module,
wherein said faulty block extracting module carries out the steps hereinabove mentioned.

BRIEF DESCRIPTION OF THE DRAWINGS

FIG. 11 shows an example of a dump list by which a block is judged to be not containing a defect in case the block is a combination circuit.

FIG. 12 shows an example of a dump list by which a block is judged to be containing a defect in case the block is a combination circuit.

FIG. 18 shows an example of a dump list by which a block is judged to be not containing a defect in case the block is a sequential circuit.

FIG. 19 shows an example of a dump list by which a block is judged to be containing a defect in case the block is a sequential circuit.

FIG. 23 is a truth table of the D-flip-flop.

PREFERRED EMBODIMENTS

Figure 1:
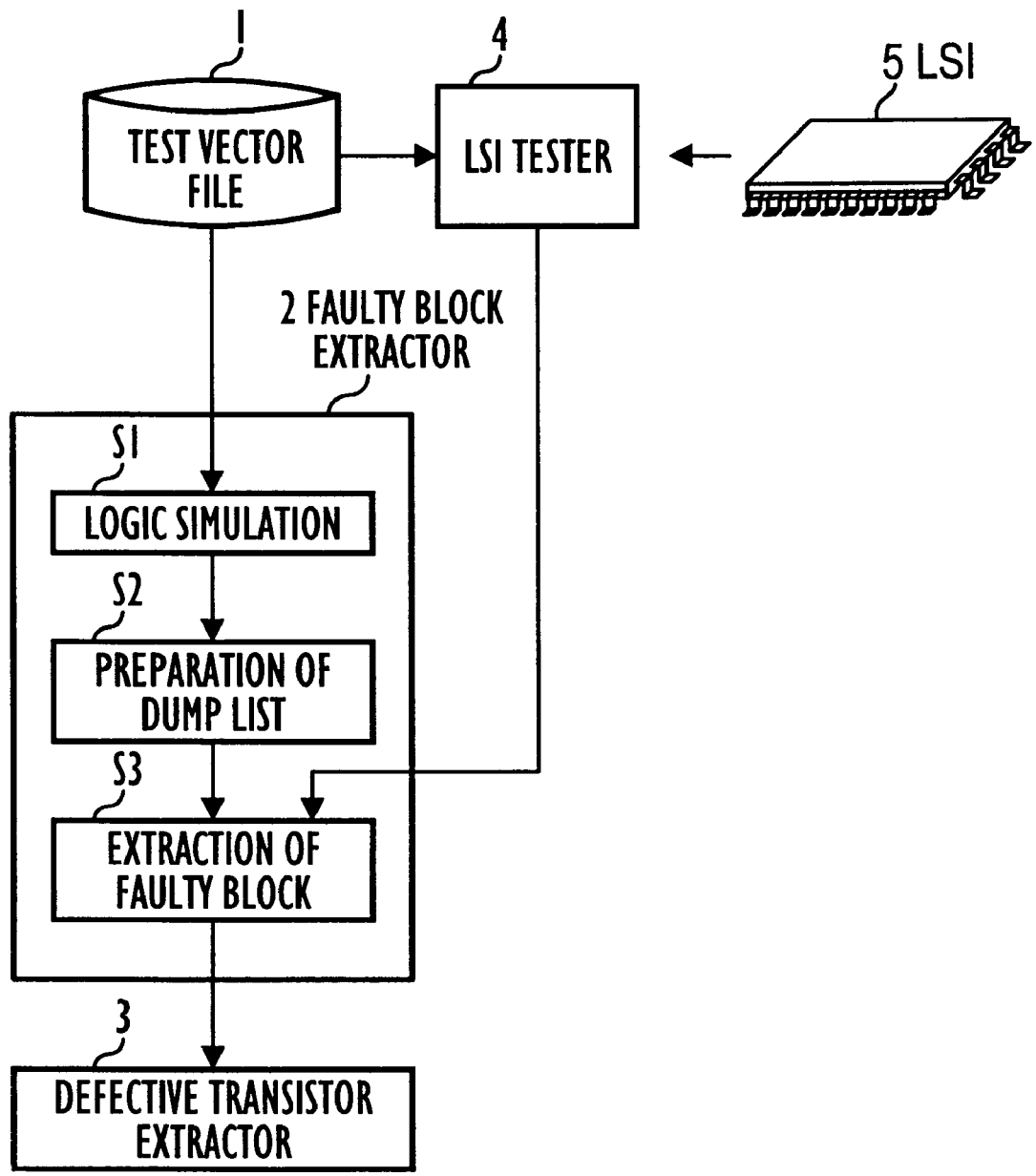
FIG. 1 is a block diagram of a system of an embodiment of the present invention.

Referring to the drawings, preferred embodiments of the present invention will be explained in detail.

Figure 2:
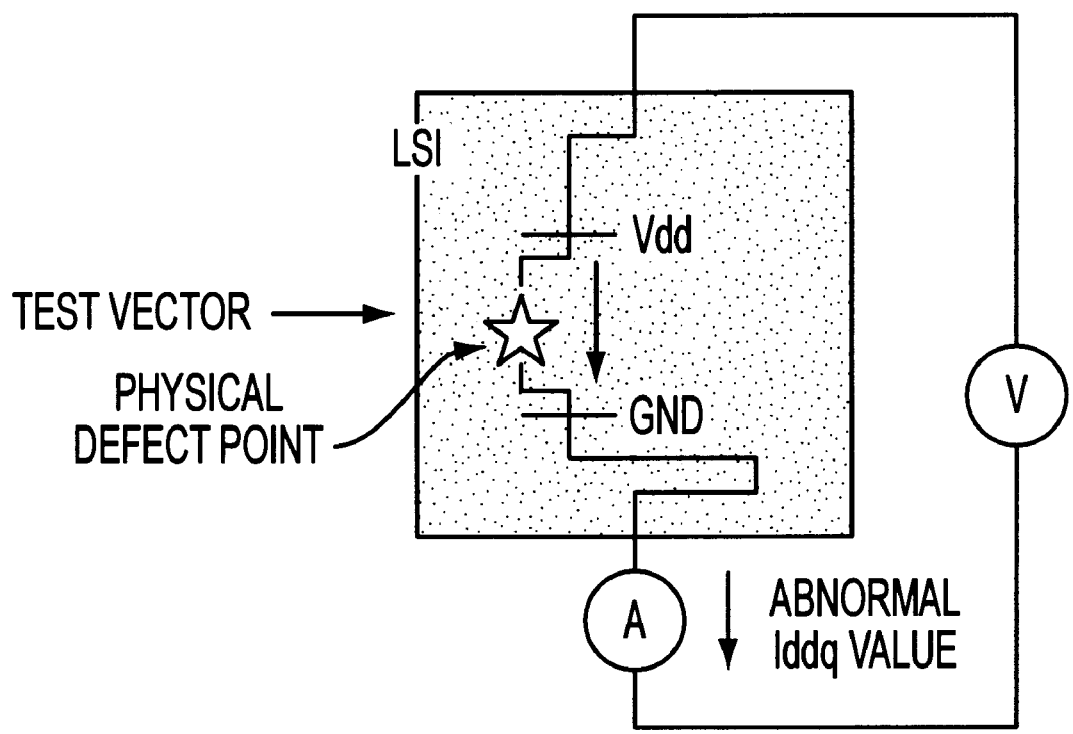
FIG. 2 shows the manner in which penetration current is generated due to the presence of a physical defect.

In a CMOS circuit, there is produced, as a general tendency, an abnormal value appears in a supply current in the logic quiescent state termed Iddq (a quiescent Vdd supply current), if the circuit suffers from an internal physical defect. FIG. 2 shows a state of generation of penetration current due to the presence of such physical defect. If such physical defect exists inside of the LSI, there is produced, by a logic set by an optional test vector, a penetration current via the physical defect or from Vdd subject to the effect of the physical defect to GND. The logic via the physical defect is propagated towards output terminals with progress of the test vector. In such case, output abnormality may or may not be produced at an output terminal.

Figure 3:
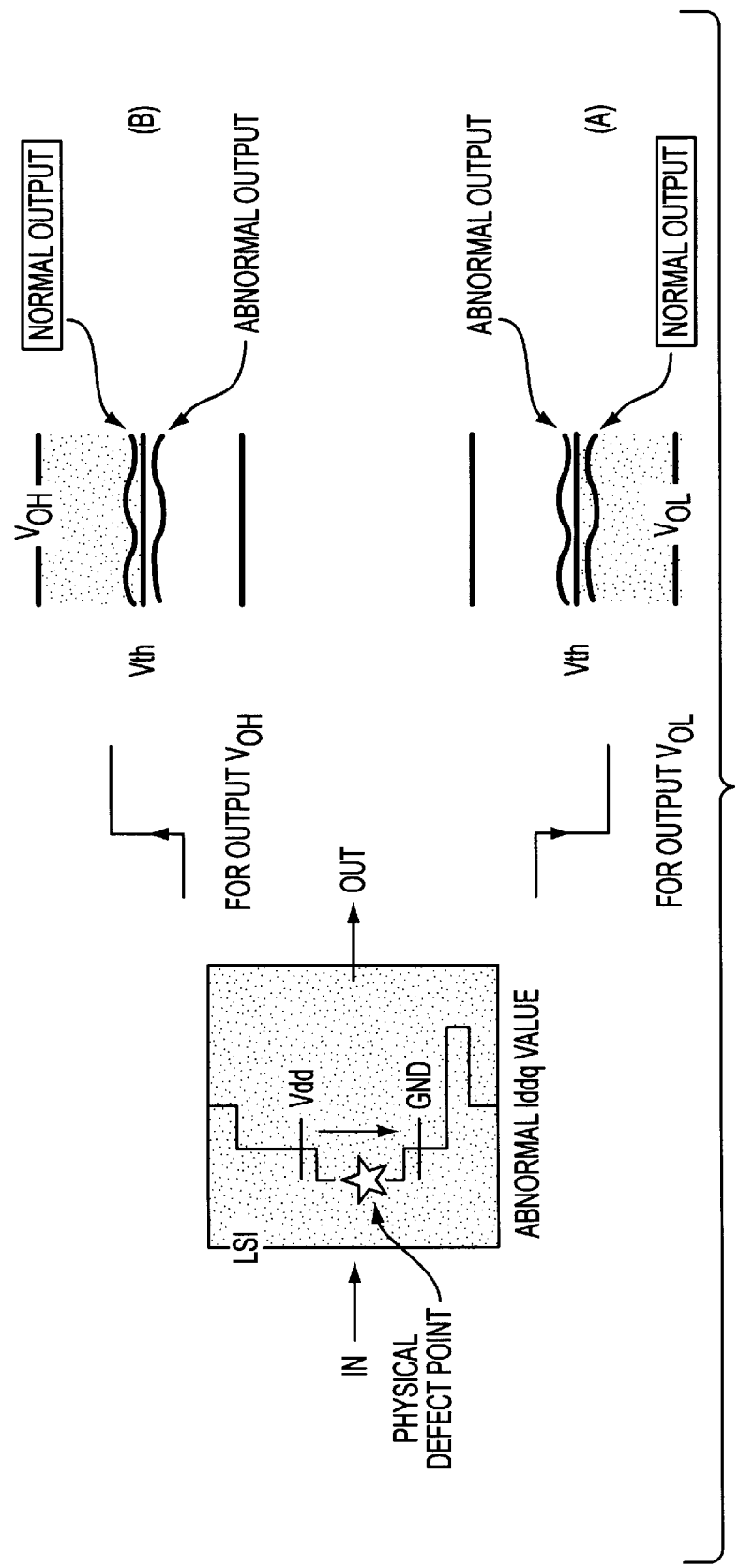
FIG. 3 shows the manner in which the output logic becomes normal or abnormal on occurrence of an abnormal Iddq value.

As shown in FIG. 3, such difference is produced as a result of the relation between an output value of the Iddq abnormality generating circuit and a threshold (Vth) value. That is, if an output value of the Iddq value abnormality generating circuit is lower than Vth, a normal logic is propagated to an output terminal as shown in FIG. 3(A). If the output value of the Iddq value abnormality generating circuit is higher than Vth, an abnormal logic is propagated to the output terminal leading to detection of an output abnormality. On the other hand, if an output value of the Iddq value abnormality generating circuit is lower than Vth with respect to the expected value "H", as shown in FIG. 3(B), an abnormal logic is propagated towards the output terminal to detect the abnormal output. Conversely, if an output value of the Iddq value abnormality generating circuit is higher than Vth, a normal logic is propagated towards the output terminal. The present invention provides a failure (defect) point identifying method effective for any of these two cases and can identify defect points by exploiting an abnormality in the Iddq value.

An application specific integrated circuit (ASIC), typified by a gate array, has circuits, termed "blocks", each constituting a fundamental logic. Any desired electrical circuit can be realized by combining these blocks. The defect points in the ASCI CMOS logic circuit can be identified using logic simulation information varying from one test vector to another and test vectors generating abnormalities in the Iddq values, as will now be explained by referring to the drawings.

FIG. 1 is a block diagram showing a computer-aided system of an embodiment of the present invention comprised of a test vector file 1, a defective block extraction module (termed as "faulty block extractor") 2, a defective transistor extraction module (termed as "defective transistor extractor") 3 and an LSI tester module (termed as "LSI tester") 4.

The test vector file 1 has stored therein plural test vectors each bearing a test vector number.

On the LSI tester 4 is loaded an LSI 5 defect points of which need to be identified. The LSI tester 4 has a function of sequentially entering the test vectors stored in the test vector file 1 to an input terminal of the loaded LSI 4 in the order of the increasing sequential number for measuring Iddq values from one test vector to another, a function of extracting test vector numbers of the test vectors carrying abnormalities represented by the Iddq values exceeding a pre-set value, a function of estimating the number of defect points based on the test vector number(s) of the test vector(s) carrying abnormalities in the Iddq values and on the Iddq values, and a function of inferring, for each defect point, at which number of the impressed test vectors the abnormalities in the Iddq values have been caused by the defect point, and outputting a set of associated test vector numbers for each defect point to the faulty block extractor 2.

The faulty block extractor 2 has a function of executing logic simulation to extract an input logic (input pattern) of each block of the LSI 5 when the test vectors stored in the test vector file 1 are entered to the input terminal of the LSI 5, a function of formulating, for each block of the LSI 5, a dump list in which the test vector numbers are associated with the input logics, and a function of identifying the faulty block based on the dump list of each block and on the test vector numbers of the test vectors producing abnormalities in the Iddq values delivered from the LSI tester 4.

The defective transistor extraction module (extractor) 3 has a function of identifying the transistor-level defect points for each d identified by the faulty block extractor 2.

The operation of the present embodiment is now explained.

A tester loads the LSI 5, defect points of which need to be identified, on the LSI tester 4, and actuates the tester.

Figure 4:
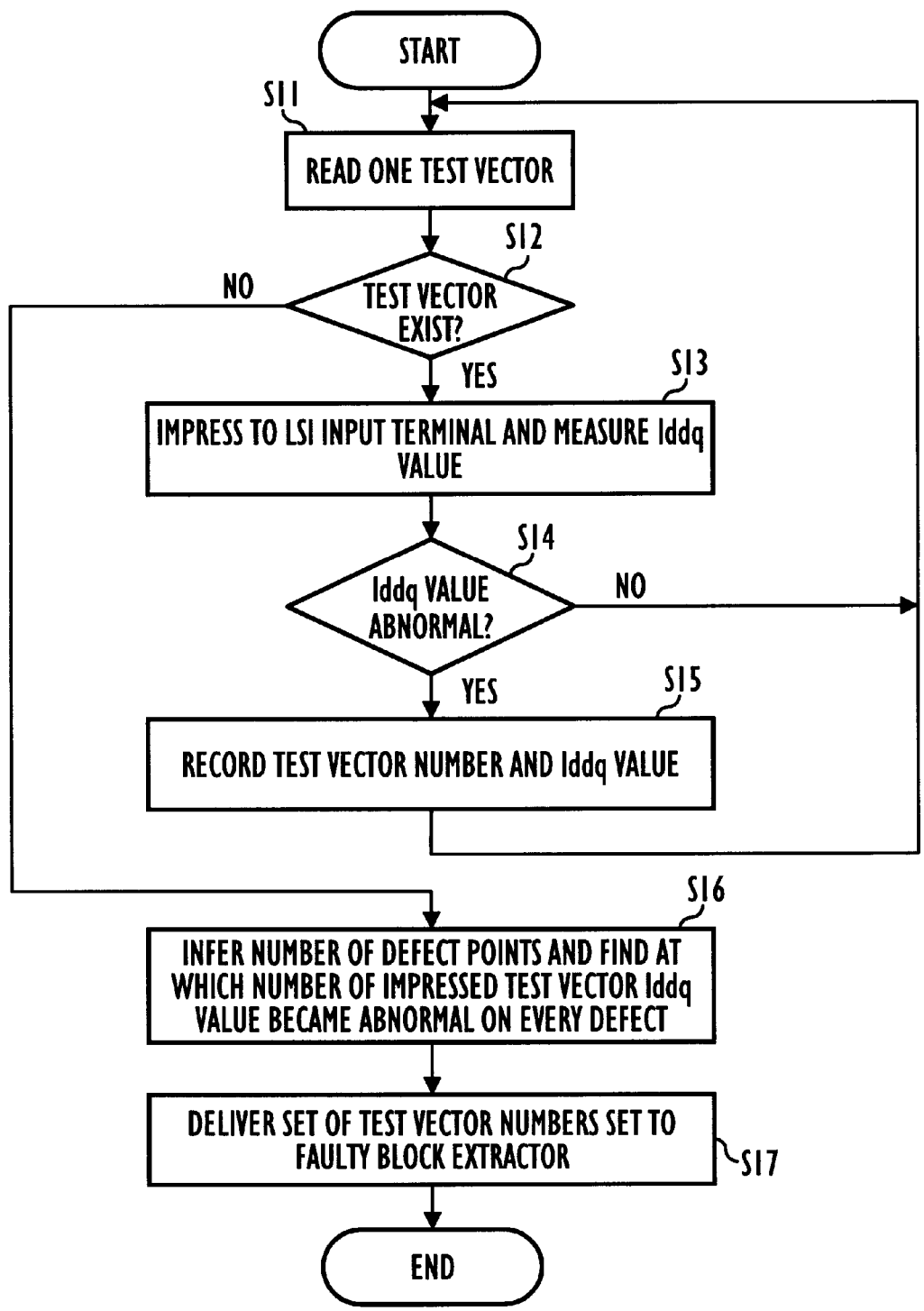
FIG. 4 is a flow diagram showing a processing example of an LSI tester 4.

The LSI tester 4 thus reads a test vector of the test vector number '1' from the test vector file 1, as shown in the flow diagram of FIG. 4 (S11).

The LSI tester 4 then impresses the test vector having the test vector number '1' to the input terminal of the loaded LSI 5, and measures the Iddq value (S13). The Iddq value, measured at S13, is a sum of Iddq values of the respective blocks of the LSI 5 on impressing the test vector having the test vector number '1'. In a normal item, the Iddq value is not larger than a rated value of, for example, 1 $\mu$m, for all test vectors. However, with a defective item, the Iddq value becomes hundreds to thousands of times as large as the value of the standard value.

The LSI tester 4 compares the Iddq value to the rated value for deciding whether or not the Iddq value is abnormal (S14). That is, if the Iddq value is larger than the rated value, the LSI tester 4 decides the Iddq value to be abnormal.

If the LSI tester decides that the Iddq value is not abnormal (that is if the result of check at S14 is NO), the LSI tester 4 reads the test vector having the test vector number '2' from the test vector file 1 at step S11 to perform the same processing as that described above. If the LSI tester decides that the Iddq value is abnormal (that is if the result of check at S14 is YES), the LSI tester 4 records the test vector number '1' of the test vector currently impressed at the input terminal of LS15 and the Iddq value as measured at step S13 as a pair at step SC, and reads the test vector having the test vector number '2' from the test vector file 1 at step S11 to perform the same processing as that described above.

The above-described processing is performed for all test vectors stored in the test vector file 1.

If the LSI tester 4 has performed the above-described processing for all test vectors stored in the test vector file, that is if the result of S12 is NO, the LSI tester 4 infers the number of defect points enclosed in the LSI 5, based on the pair of the test vector number and the Iddq value, recorded at S15, for finding, for each defect, at which test vector number abnormalities occurred in the Iddq value (S16).

The LSI tester 4 then delivers at S17 the set of the test vector number associated to each defect to the faulty block extractor 2 (S17) to terminate the processing.

Figure 5:
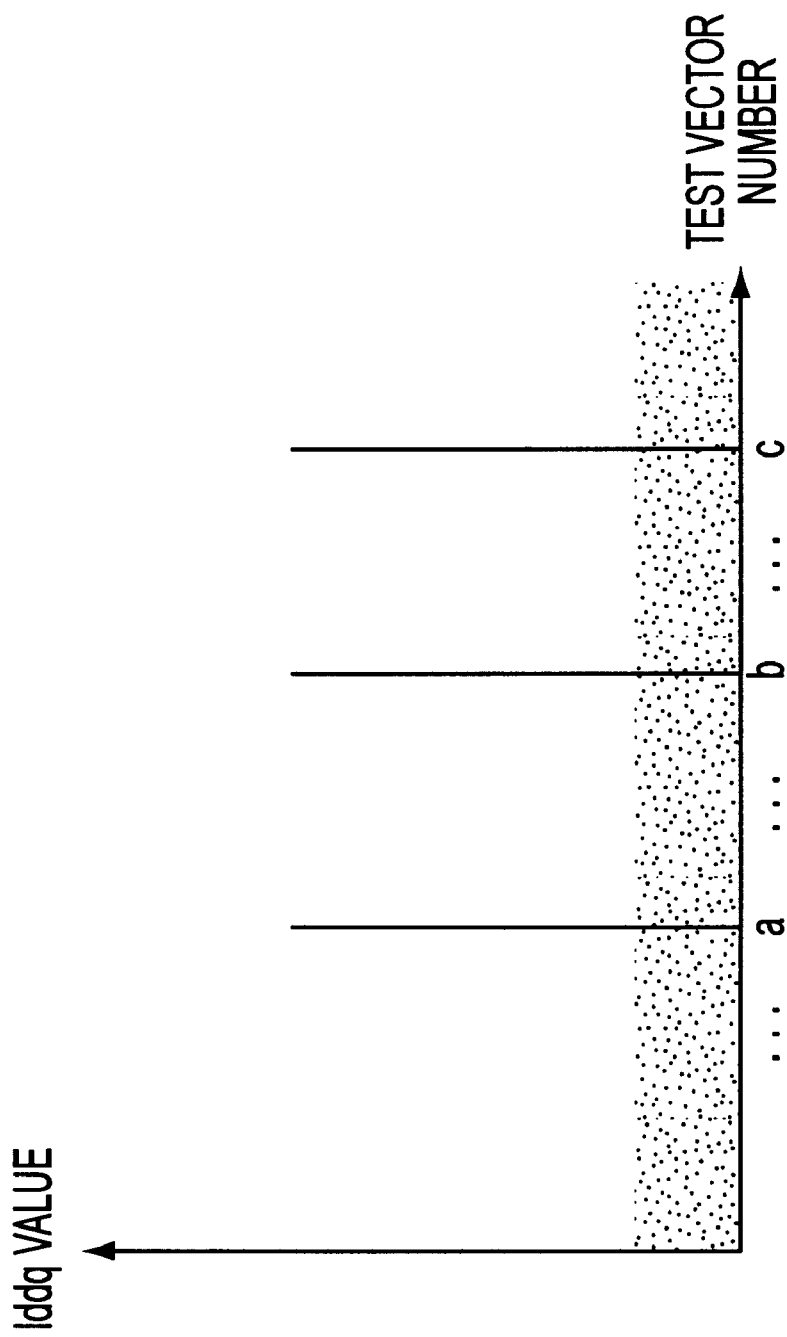
FIG. 5 is a graph showing the relation between the test vector number and the Iddq value.

It is assumed that the Iddq values obtained on sequentially impressing the test vectors stored in the test vector file 1 to the input terminal of the LSI 5 are as shown in the graph of FIG. 5. In the graph of FIG. 5, the abscissa and the ordinate stand for the test vector number and the Iddq value, respectively. The Iddq value assumes the same value $\alpha$ on impression of each test vector having the test vector number of a, b and c.

In this case, since an abnormality is produced in the Iddq value only when the test vectors bearing the test vector numbers of a, b and c are applied (the result of S14 is YES), the faulty block extractor 2 records the test vector number a and the Iddq value $\alpha$, the test vector number b and the Iddq value $\alpha$ and the test vector number c and the Iddq value $\alpha$ in association with each other.

The faulty block extractor 2 then estimates the number of the defect points and, for each defect and for each defect point, finds at which impressed test vector number abnormality occurred in the Iddq values (S16). In the present example, the values of the abnormal Iddq values are all equal to $\alpha$, so that the faulty block extractor 2 infers (estimates) that the number of defect point is one and, as for this defect point, recognizes that the abnormal value of the Iddq value has occurred on impressing the test vectors having the test vector numbers a, b and c. The faulty block extractor 2 then delivers a set of the test vector numbers a to c to the faulty block extractor 2 (S17).

Figure 6:
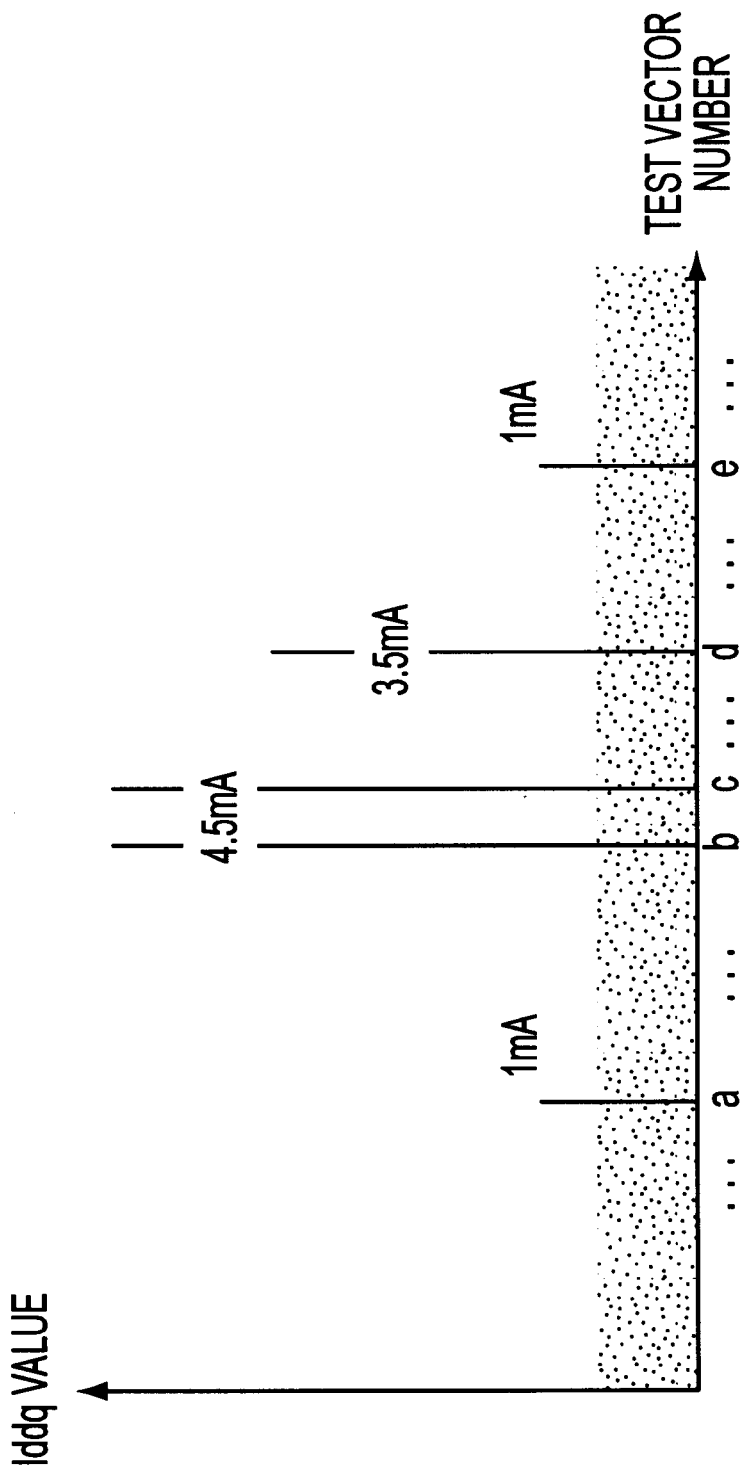
FIG. 6 is another graph showing the relation between the test vector number and the Iddq value.

Now assume that the Iddq values obtained on sequentially impressing the test vectors stored in the test vector file 1 to the input terminal of the LSI 5 are as shown in the graph of FIG. 6. That is, it is assumed that the Iddq value on impressing the test vectors having the test vector numbers a and e is 1 mA, that on impressing the test vectors having the test vector numbers b and c is 4.5 mA, and that on impressing the test vector having the test vector number d is 3.5 mA, with the remaining Iddq values on impressing the test vector having the test vector numbers other than those specified above being not more than the prescribed value.

In this case, since abnormalities occur in the Iddq value only on impression of the test vectors having the test vector numbers of a, b, c, d and e (S14 YES), the faulty block extractor 2 records the test vector number a and the Iddq value of 1 mA in association with each other. Similarly, the faulty block extractor 2 records the test vector number b and Iddq value of 4.5 mA, test vector number c and Iddq value of 4.5 mA, test vector number d and Iddq value of 3.5 mA and test vector number e and Iddq value of 1 mA in association with each other.

The faulty block extractor 2 then estimates the number of defect points and finds, for each defect and for each defect point, at which number of the test vector impressed an abnormality occurred in the Iddq value (S16).

Since different abnormal Iddq values exist in the present example, the LSI tester 4 judges that there are plural defect points (multiple defects) and performs the following processing: That is, it first classifies the abnormal Iddq values. By performing this classification, it is found that the Iddq value for the impressed test vectors having the test vector numbers b and c is maximum and is 4.5 mA, the Iddq value for the impressed test vectors having the test vector numbers a and e is the second largest and is 3.5 mA, with the Iddq value on impressing the test vector having the test vector numbers a and e being the smallest and equal to 1 mA. This case can be predicted to be '4.5 mA=3.5 mA+1 mA'. That is, it may be conceived that there are a defect responsible for the abnormal Iddq value of 3.5 mA and a defect responsible for the abnormal Iddq value of 1 mA and that the abnormal Iddq value of 4.5 mA is produced on impressing the test vectors bearing the test vector numbers b and c as a result of addition of the abnormal Iddq values due to these two defects. From the above, it may be inferred that there exist two defects in the LSI 5 and that the abnormal Iddq value of 1 mA is generated for one of the defects on impressing the test vectors having the test vector numbers a, b, c and e, while the abnormal Iddq value of 3.5 mA is generated for the other defect on impressing the test vectors having the test vector numbers b, c and d.

On recognizing that there exist a defect which gives an abnormal Iddq value on impressing the test vector numbers a, b, c and e and a defect which gives an abnormal Iddq value on impressing the test vector numbers b, c and d, the faulty block extractor 2 delivers the test vector numbers a, b, c and e as a set to the faulty block extractor 2, while delivering the test vector numbers b, c and d as a set to the faulty block extractor 2 (S17).

Next, the operation of the faulty block extractor 2 is explained.

Figure 7:
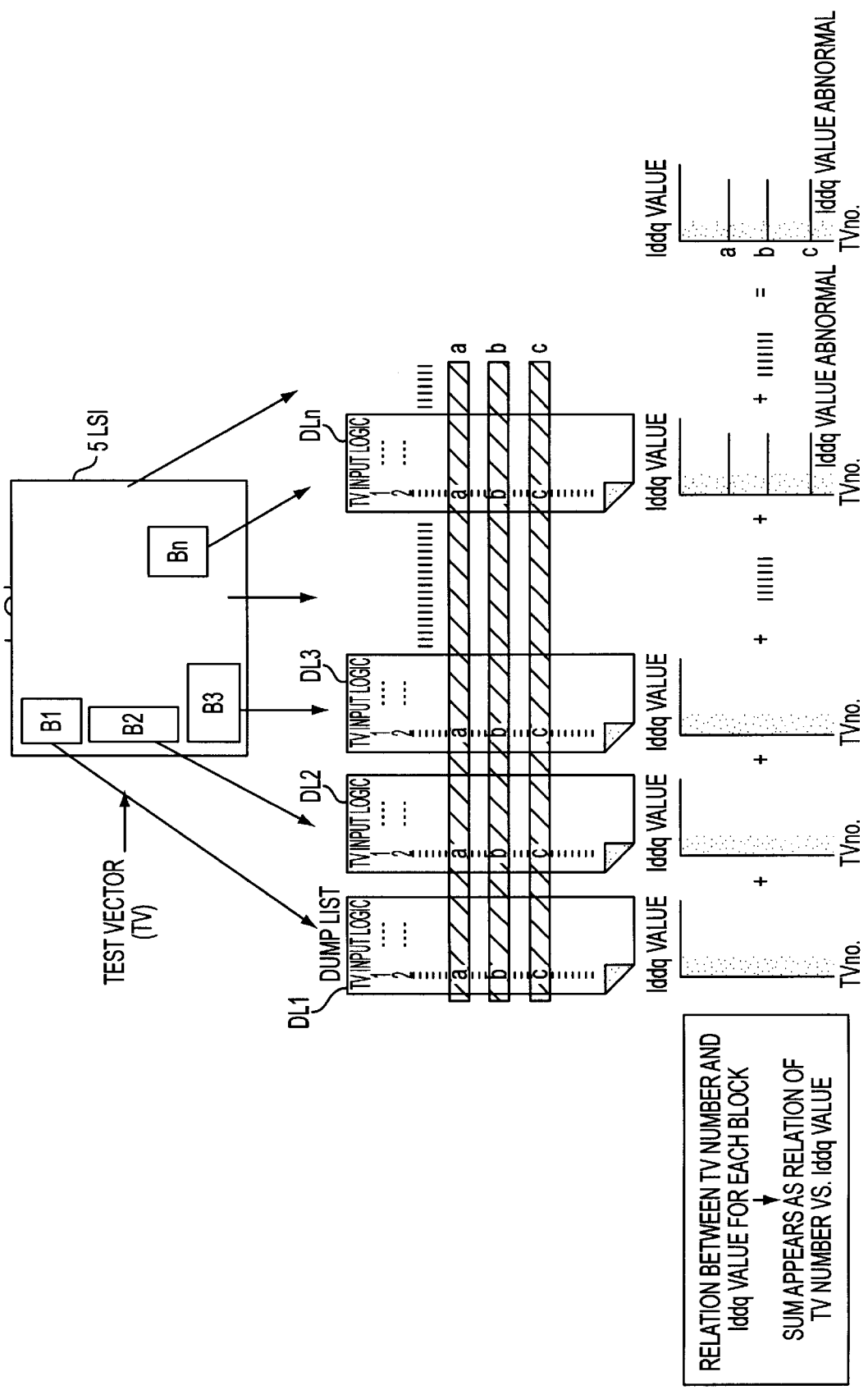
FIG. 7 illustrates processing by a faulty block extractor 2.

The faulty block extractor 2 first executes logic simulation in order to find the input logic of the blocks B1, B2, . . . , Bn, . . . (FIG. 7) constituting the LSI 5 on impressing the test vectors stored in the test vector file 1 across the input terminals of the LSI 5 (FIG. 1, S1).

The faulty block extractor 2 then formulates dump lists DL1, DL2, . . . , DLn, . . . for each of the blocks B1, B2, . . . , Bn, . . . making up the LSI 5 (S2). In the dump lists DL1, DL2, . . . , DLn, . . . , the test vector numbers and the input logics of the blocks B1, B2, . . . , Bn, . . . , when the test vectors of the test vector numbers have been entered.

The faulty block extractor 2 then identifies the block containing the defect, using the sets of the test vector numbers handed over by the LSI tester 4 and dump lists DL1, DL2, . . . , DLn, . . . of the blocks B1, B2, . . . , Bn, . . . and delivers the information specifying the block to the defective transistor extractor 3 (S3). The processing of S3 is hereinafter explained in detail by referring to the flow diagram of FIG. 8.

At S3, the faulty block extractor 2 first selects an unprocessed one of the test vector number sets delivered from the LSI tester 4 (S31). The block B1 of the blocks making up the LSI 5 is taken as a subject (target) of processing (S33, S34).

The faulty block extractor 2 then judges whether the block B1 is a combination circuit or a sequential circuit (S36) and gives decision on whether or not a defect is contained in the block B1 based on the result of this judgment, the set of test vector numbers selected at S31 and the dump list DL1 associated with the block B1 (S37, S38). The combination circuit is such a circuit in which, if a signal is entered in its input terminal, its logic is directly outputted via an internal circuit, and covers a wide range of circuits from a small scale circuit such as a basic gate (AND, OR or NAND gates or inverter circuits) to large scale circuits such as ALU or ADDER. The sequential circuit is such a circuit in which data is transiently stored in the circuit in synchronism with clock signals and is outputted by the next clock signal, and may be enumerated by flipflops, registers or latch circuits. The processing of S37 will be explained subsequently in detail.

If the block B1 is judged to contain no defect, that is if the result of S38 is NO, processing similar to that described above is carried out on the next block B2 as the subject of processing (S40 and S34). If the block B1 is judged to contain a defect, that is if the result of S38 is YES, the information specifying the block B1 is recorded in association with the set of the test vector numbers selected at S31 (S39). Then, processing similar to that described above is carried out on the next block B2 as the subject of processing (S40 and S34).

If the above processing has been carried out for all blocks in the LSI 5, that is if the result of S35 is NO, an unprocessed one of the test vector number sets delivered from the LSI tester 4 is selected (S31) to perform processing similar to that described above. If the above processing has been carried out for all test vector number sets delivered from the LSI tester 4, that is if the result of S32 is NO, the information recorded at S39 (a set of the information specifying a block judged to contain the defect and the test vector number) is delivered to the defective transistor extractor 3 (S41) to terminate the processing.

Figure 9:
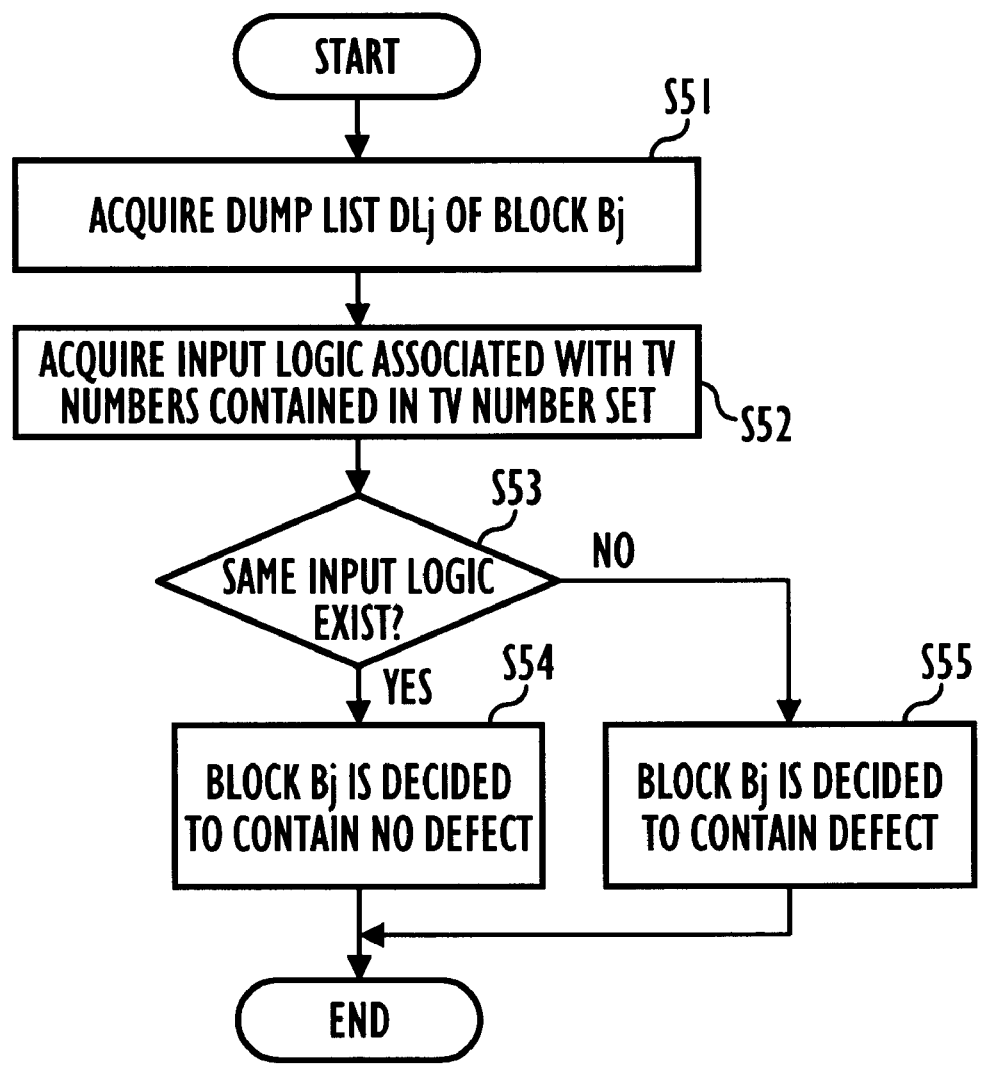
FIG. 9 is a flow diagram showing processing by the faulty block extractor 2 wherein a block being processed is a combination circuit.
Figure 10:
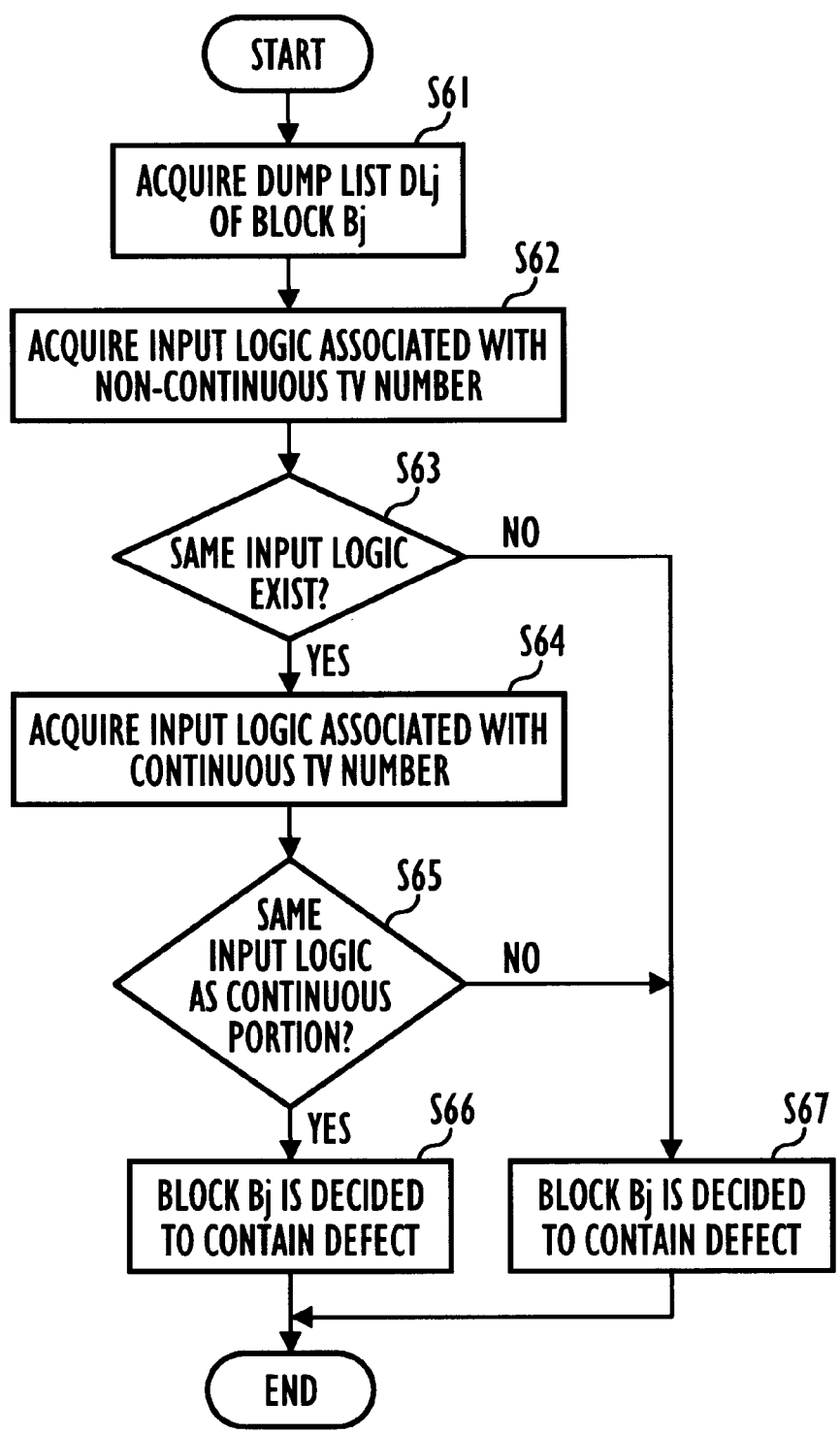
FIG. 10 is a flow diagram showing processing by the faulty block extractor 2 wherein a block being processed is a sequential circuit.

The processing carried out at S37 will be explained in detail. FIG. 9 shows a flow diagram showing a processing example of S37 if the block Bj has been judged at S36 to be a combination circuit, while FIG. 10 shows a flow diagram showing a processing example of S37 if the block Bj has been judged to be a sequential circuit.

Referring first to FIG. 9, a processing example in which the block Bj has been judged to be a combination circuit is explained.

Figure 8:
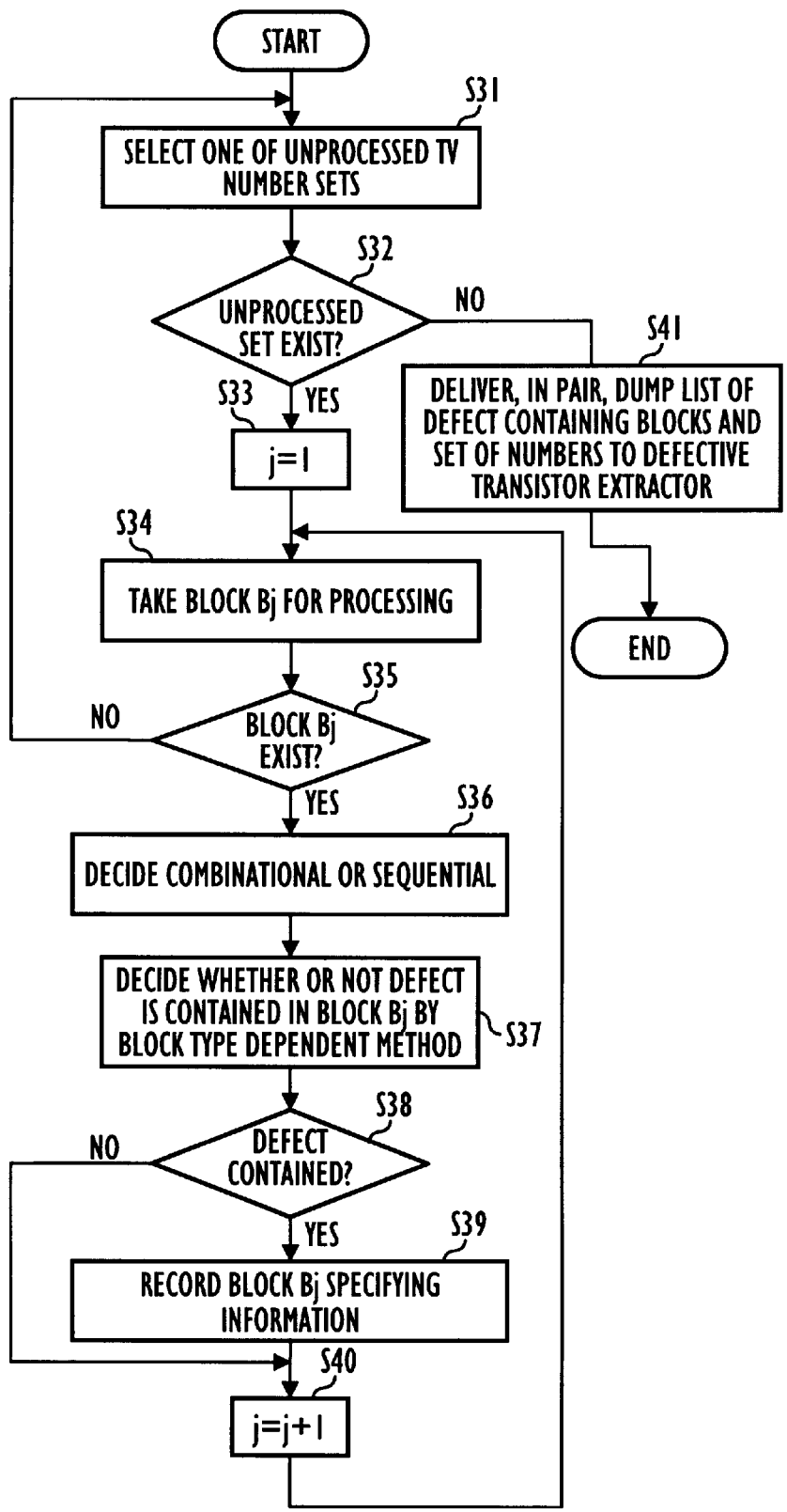
FIG. 8 is a flow diagram showing processing by the faulty block extractor 2.

The faulty block extractor 2 acquires a dump list DLj of the block Bj being processed (S51). Then, from the input logics contained in the dump list DLj, an input logic associated with the test vector number contained in the test vector number set selected at S31 of FIG. 8 is acquired (S52). That is, the input logic of the block Bj associated with the test vector responsible for the abnormal Iddq value is acquired.

It is then checked whether or not the input logic which is the same as that acquired at S52 exists in other portions of the dump list DLj (S53). If the same input logic exists, it is judged that the block Bj is free of defects (S54). If the same input logic does not exist, the block Bj is judged to contain a defect (S55). These judgments are given for the reason that only one internal logic is permitted at all times for an arbitrary input logic and that, if there exists the same input logic, priority is for an alternative that the block contains no physical defect rather than for an alternative that the block contains s physical defect. In addition, if only one such test vector exhibits an abnormal Iddq value, there does not exist a fact which negates the phenomenon.

Now it is assumed that the dump list DLj of the block Bj acquired at S51 is as shown in FIG. 11, and only the test vector number a is contained in the test vector number set selected at S31 of FIG. 8. Since the input logic which is the same as the input logic "011110001" associated with the test vector number a is contained in the dump list DLj in association with the test vector number not producing an abnormal Iddq value, that is since the result of S53 is YES, the block Bj is judged to contain no defect (S54).

Also, it is assumed that the dump list DLj of the block Bj acquired at S51 is as shown in FIG. 12, and that only the test vector number a is contained in the test vector number set selected at S31 in FIG. 8. Since the input logic which is the same as the input logic "011110001" associated with the test vector number a is not contained in other portions of the dump list DLj, that is since the result of S53 is NO, the block Bj is judged to contain a defect (S55).

Figure 13:
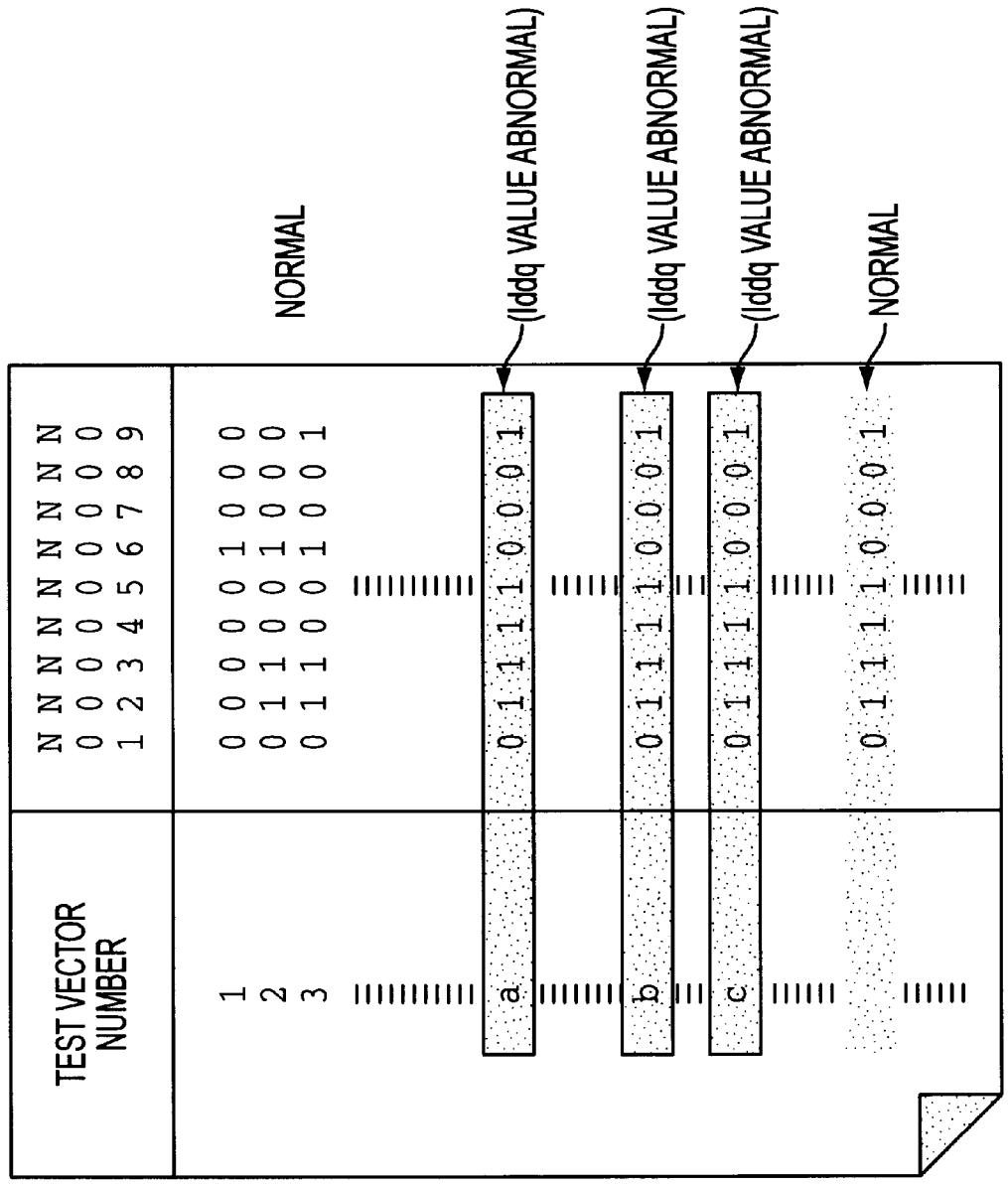
FIG. 13 shows another example of a dump list by which a block is judged to be not containing a defect in case the block is a combination circuit.

Further, it is assumed that the dump list DLj of the block Bj acquired at S51 is as shown in FIG. 13, and the test vector number set selected at S31 of FIG. 8 is constituted by test vector numbers a, b and c. As may be seen from FIG. 13, the input logic associated with the test vector numbers a, b and c are all "011110001". In the present example, since the input logic is contained in the dump list DLj in association with the test vector number of the test vector not producing an abnormality in the Iddq value, that is since the result of S53 is YES, the block Bj is judged to be not containing a defect (S54).

Figure 14:
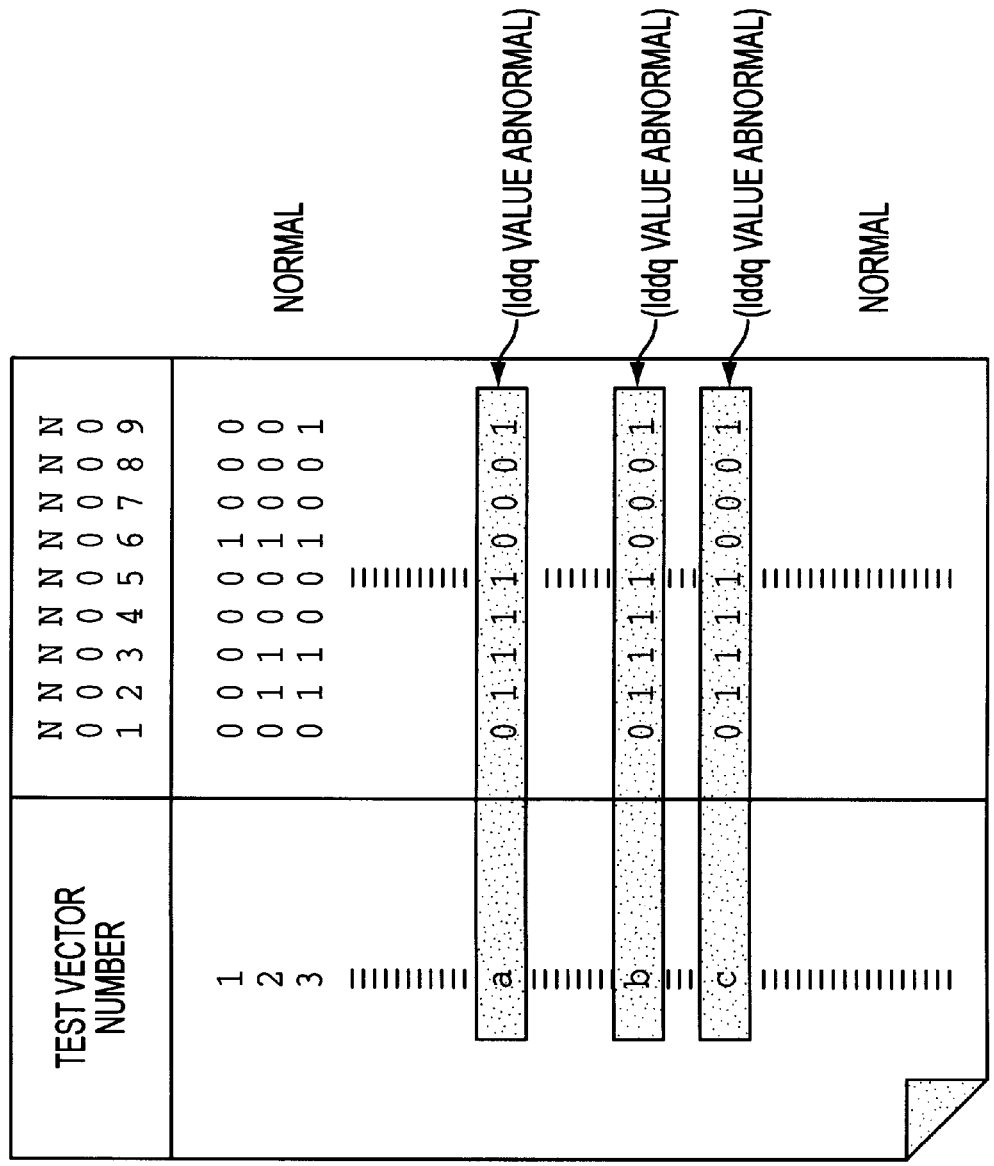
FIG. 14 shows another example of a dump list by which a block is judged to be containing a defect in case the block is a combination circuit.

It is then assumed that the dump list of the block Bj acquired at S51 is as shown in FIG. 14, and that the set of the test vector numbers selected at S31 of FIG. 8 is constituted by the test vector numbers a, b and c. As may be seen from FIG. 14, the input logics associated with the test vector numbers a, b and c are all "011110001". Since the same logic as the input logic associated with the input logic "011110001" associated with the test vector numbers a, b and c is not contained in other portions of the dump list DLj, that is since the result of S53 is NO, the block Bj is judged to contain a defect (S55).

Figure 15:
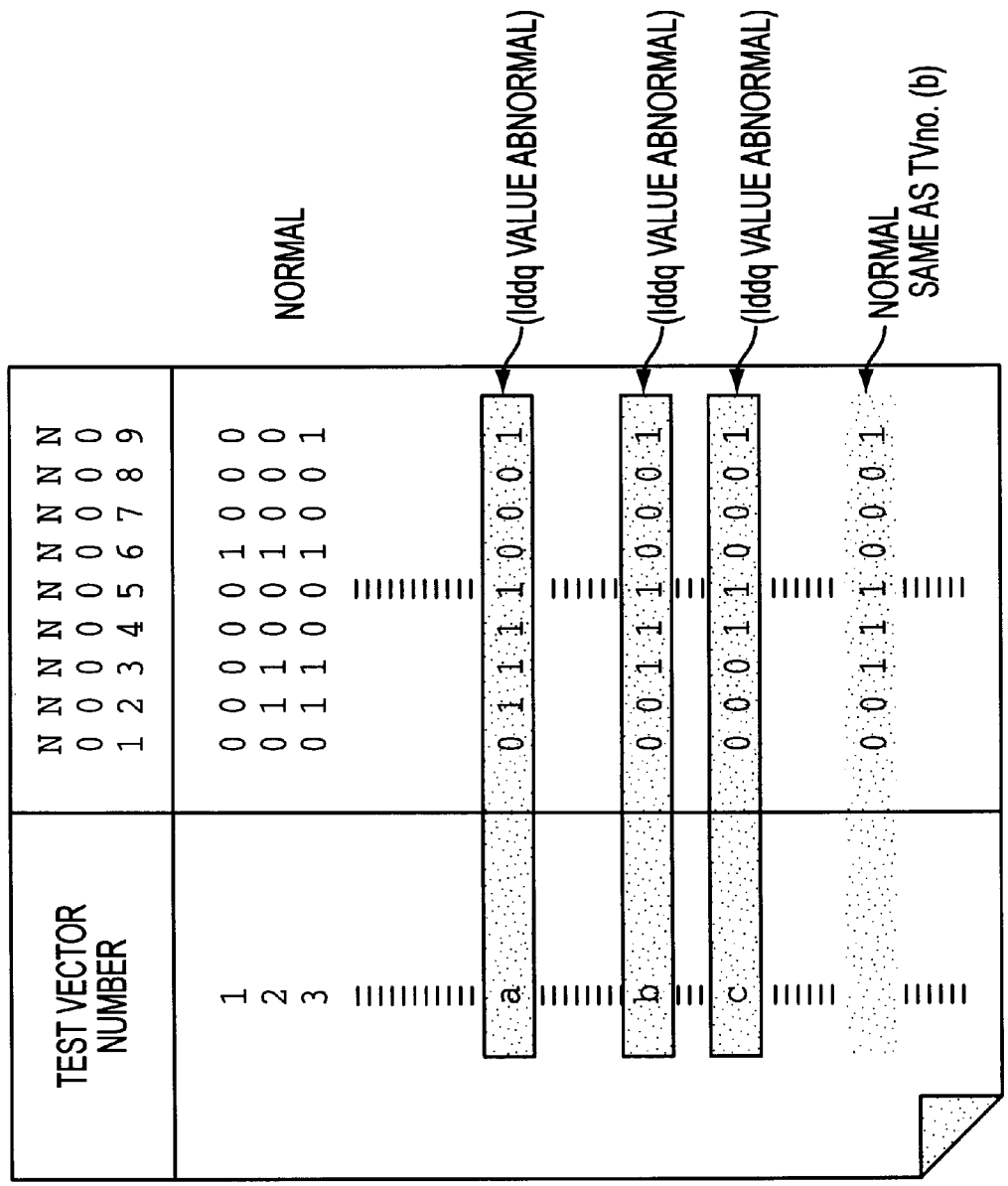
FIG. 15 shows still another example of a dump list by which a block is judged to be not containing a defect in case the block is a combination circuit.
Figure 16:
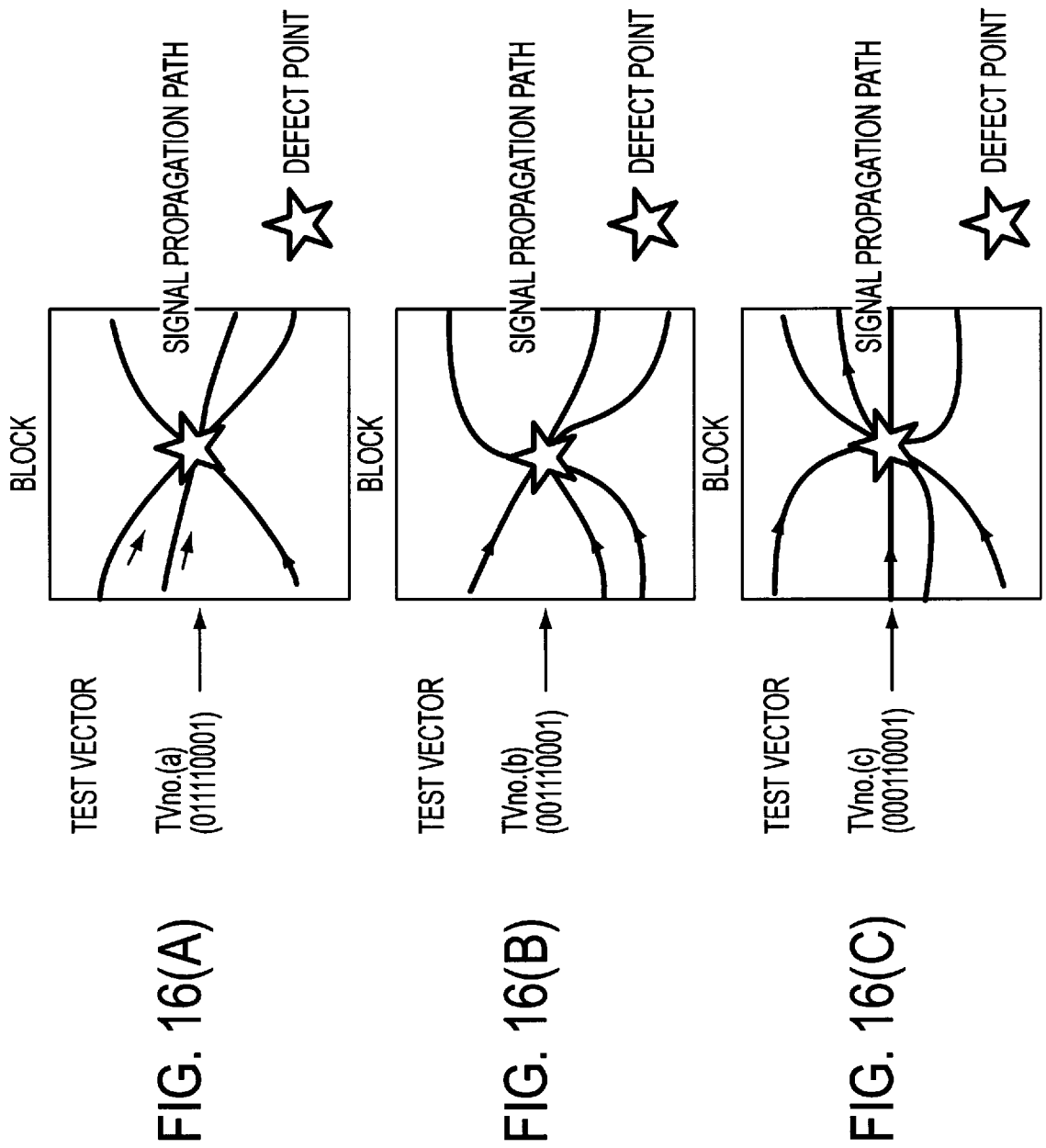
FIG. 16 shows the relation between test vectors and a defect point.

It is then assumed that the dump list DLj acquired at S51 is as shown in FIG. 15, and that the test vector number set selected at S31 of FIG. 8 constituted by the test vector numbers a, b and c. As may be seen from FIG. 15, the input logics associated with the test vector numbers a, b and c are "011110001", "001110001" and "000110001", respectively. Since the input logic "001110001" associated with the test vector number b is also contained in this example in other portions of the dump list DLj, that is since the result of S53 is YES, the block Bj is judged to be not containing a defect (S454). In this example, three test vectors a, b and c are producing Iddq abnormal values for one defect. As will be apparent from the relation between the test vectors shown in FIG. 16 and the defect point, this means that the test vectors of the test vector numbers a, b and c producing abnormal Iddq values set the same logic of producing an abnormal Iddq value for one defect point in the internal circuit constituting the block Bj. Therefore, the fact that the input logic which is the same as the normal test vector exists in at least one of three input logics means that Iddq value abnormality is not produced by the logic set for the defect point. Moreover, since the Iddq value abnormality is construed to be not produced for three different input logics, there is produced conflict with respect to the presupposition. Therefore, if there exists the same input logic as at least one input logic, this block is judged to be not containing a physical defect.

Figure 17:
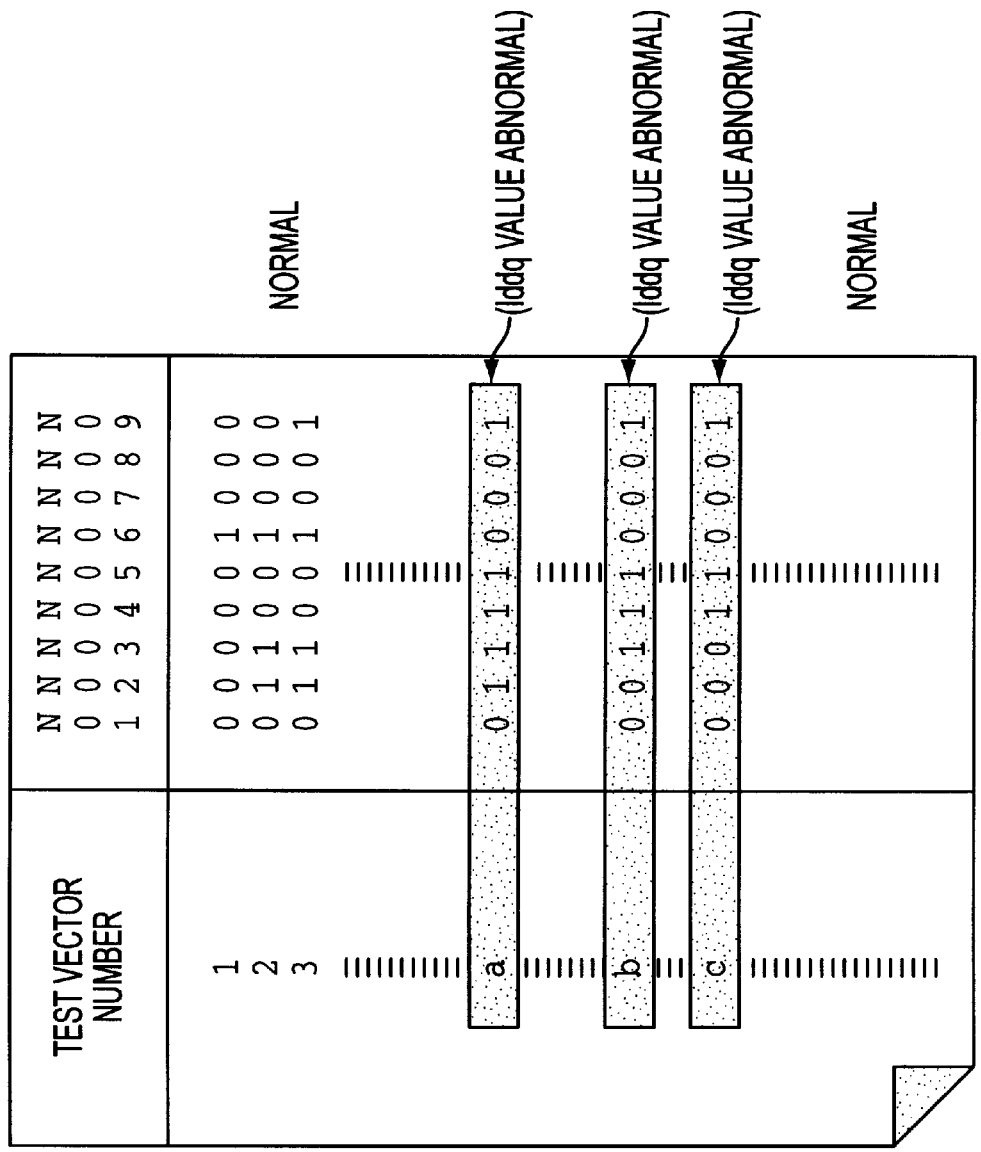
FIG. 17 shows still another example of a dump list by which a block is judged to be containing a defect in case the block is a combination circuit.

It is then assumed that the dump list DLj of the block Bj acquired at S51 is as shown in FIG. 17, and that the set of the test vector numbers selected at S31 of FIG. 8 is constituted by the test vector numbers a, b and c. As may be seen from FIG. 17, the input logics associated with the test vector numbers a, b and c are "011110001", "001110001" and "000110001", respectively. Since the input legacies "011110001", "001110001" and "000110001" associated with the test vector numbers a, b and c, respectively, are not present in other portions of the dump list DLj, that is since the result of S53 is NO, the block Bj is judged to be containing a defect (S55).

Referring to the flow diagram of FIG. 10, an illustrative processing of S37 when the block Bj has been judged at step 36 of FIG. 8 to be a sequential circuit will be explained.

The faulty block extractor 2 acquires a dump list DLj of the block Bj under current processing (S61). The faulty block extractor 2 then acquires an input logic that is present in the test vector number set selected at S31 of FIG. 8 and that is associated with the non-contiguous vector numbers (S62). It is then checked whether or not the same input logic as the acquired input logic is present in the portion of the dump list associated with the test vector not producing an abnormality in the Iddq value (S63). At S63, it is judged whether or not there exists a defect in a data input/output portion among the data input/output portion and a data holding portion constituting the sequential circuit.

If the same input logic is judged to be not present at S63, that is if there is a defect in the data input/output portion, the block Bj is judged to be containing a defect (S67). If the same input logic is judged to be present at S63, that is if there is no defect in the data input/output portion, the processing from S64 on is carried out for investigating whether or not there is any defect in the data holding portion.

At S64, an input logic associated with the continuous test vector number present in the test vector number selected at S31 of FIG. 8 is acquired from the dump list DLj. At S65, it is judged whether or not the set of input logics same as the contiguous portion is present in the portion of the dump list DLj associated with the test vector not generating abnormality in the Iddq value (S65). At S65, it is judged whether or not a defect is present in the data holding portion of the sequential circuit.

If it is judged at S65 that there exists the same input logic, the block Bj is judged not to contain a defect (S66). If it is judged that there does not exist the same input logic, the block Bj is judged to contain a defect (S67).

It is now assumed that the dump list DLj of the block Bj acquired at S61 of FIG. 10 is as shown in FIG. 18, and '41', '42' are present in the continuous test vector number in the set of test vector numbers selected at S31 in FIG. 8. In the present example, the input logic that is acquired by the processing of S64 and that is associated with the test vector numbers '41', '42' are "01111" and "01110", respectively, and the same input logic exists in the normal portion of the dump list DLj, the block Bj is judged not to contain a defect (S66).

It is now assumed that the dump list DLj of the block Bj acquired at S61 of FIG. 10 is as shown in FIG. 19, and '41', '42' are present as contiguous test vector numbers in the set of test vector numbers selected at S31 in FIG. 8. In the pr!s!nt example, the input logic that is acquired by the processing of S64 and that is associated with the test vector numbers '41', '42' are "01111" and "01110", and the same input logics do not exist in the normal portion of the dump list DLj, the block Bj is judged to contain a defect (S67).

Figure 20:
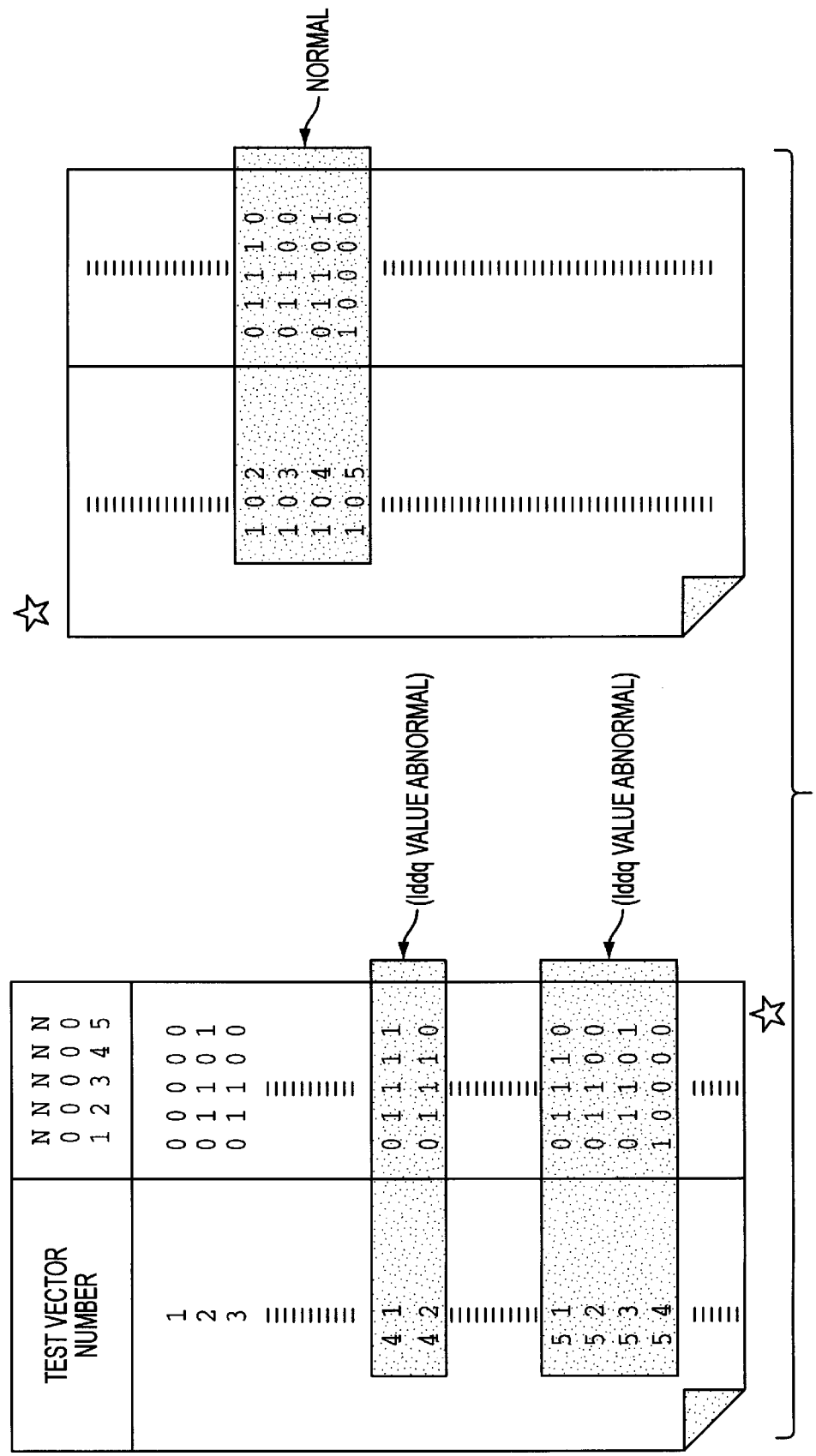
FIG. 20 shows another example of a dump list by which a block is judged to be not containing a defect in case the block is a sequential circuit.

It is now assumed that the dump list DLj of the block Bj acquired at S61 of FIG. 10 is as shown in FIG. 20, and '41', '42' and '51', '52', '53' and '54' are present as contiguous test vector numbers in the set of test vector numbers selected at S31 in FIG. 8. In the present example, the input logics acquired by the processing of S64 and that are associated with the test vector numbers '41', '42' are "01111" and "01110", while the input logics associated with the test vector numbers '51', '52', '53' and '54' are "01110", "01100", "01101" and "10000", respectively, and the same input logics exist in the normal portion of the dump list DLj, the block Bj is judged not to contain a defect (S66).

Figure 21:
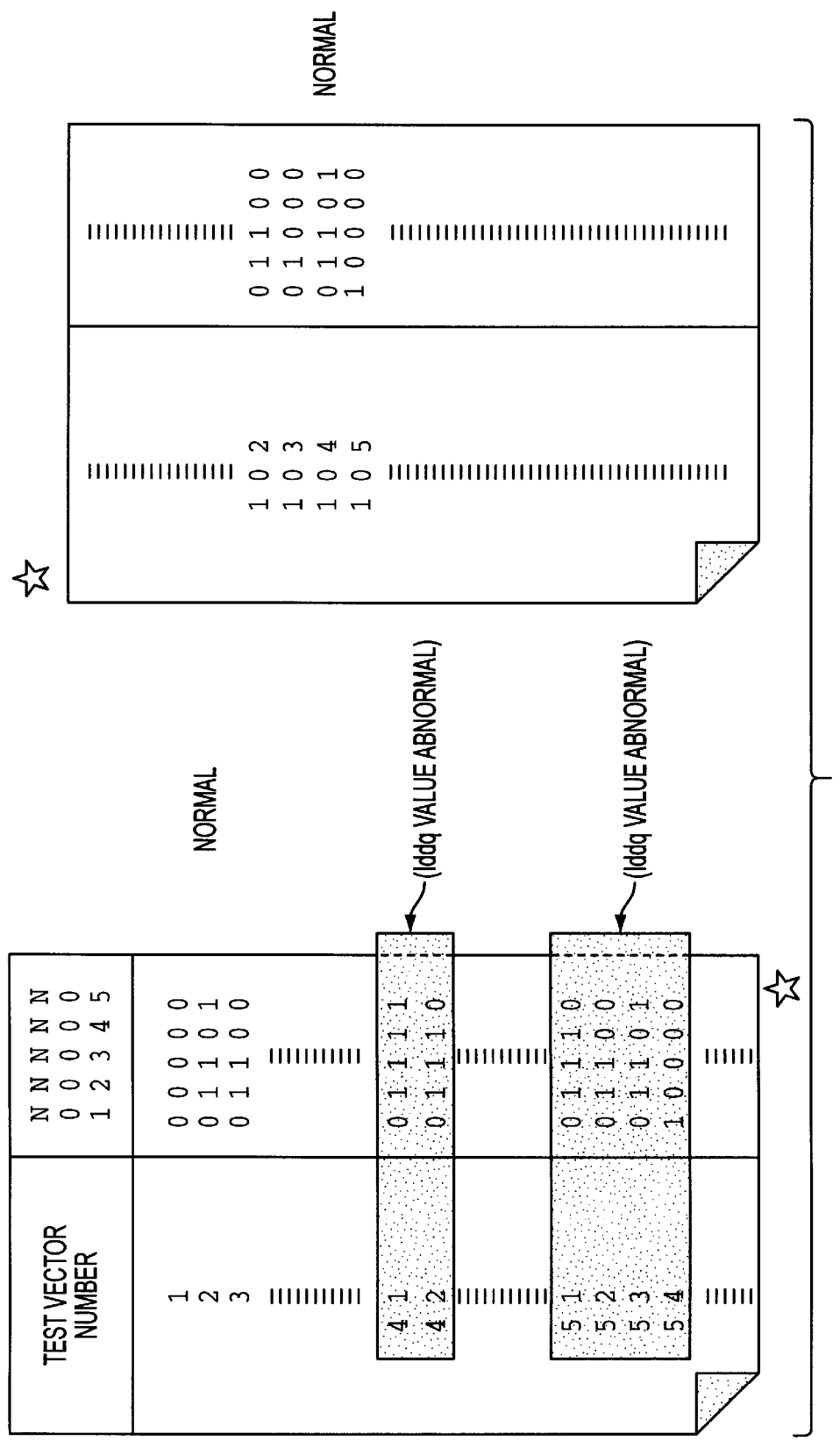
FIG. 21 shows another example of a dump list by which a block is judged to be containing a defect in case the block is a sequential circuit.

It is now assumed that the dump list DLj of the block Bj acquired at S61 of FIG. 10 is as shown in FIG. 21, and '41', '42' and '51', '52' and '53' are present as contiguous test vector numbers in the set of test vector numbers selected at S31 in FIG. 8. In the present example, the input logics acquired by the processing of S64 and that are associated with the test vector numbers '41', '42' are "01111" and "01110", while the input logics associated with the test vector numbers '51', '52', '53' and '54' are "01110", "01100","01101" and "10000", and the same input logics are absent in the normal portion of the dump list DLj, the block Bj is judged to contain a defect (S67).

Figure 22:
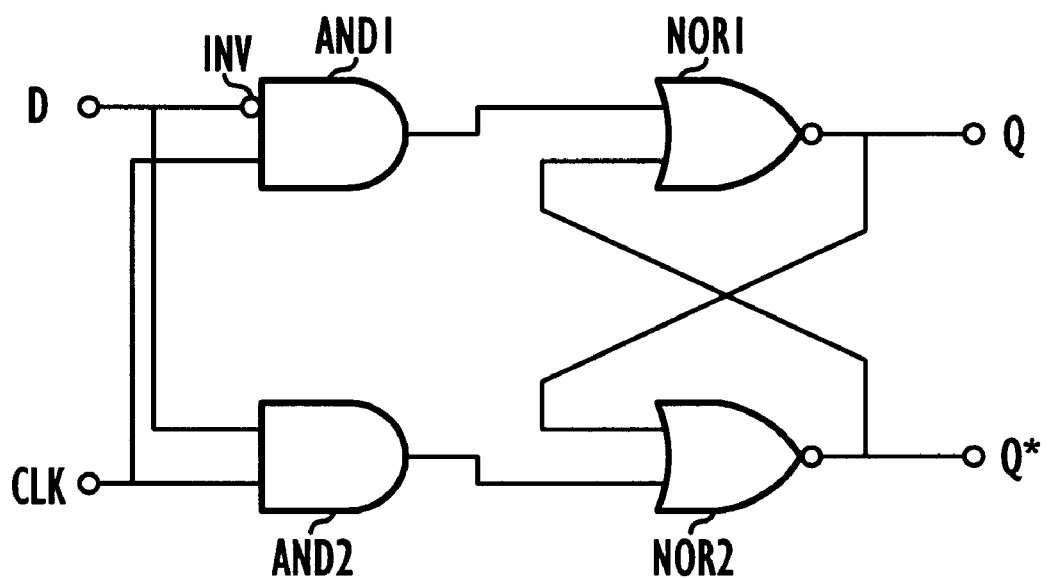
FIG. 22 is a circuit diagram of a D-flip-flop.

The reason for giving the above judgments is shown in FIG. 22. A D-type flipflop (DF/F), which is a basic data holding portion, is taken as an example.

FIG. 22 shows a circuit structure of a DF/F having a group of terminals of two inputs and two outputs (Q, Q*) made up of one inverter circuit INV, two two-input AND gates AND1 and AND2 and two two-input NOR gates NOR1, NOR2, where D and CLK denote a data terminal and a clock terminal respectively, while Q* denotes the inverse logic of Q. FIG. 23 shows the truth table. Now assume that in the DF/F, when the NOR gate NOR1 on the Q-output side is high (H), that is if the test vector numbers are '6', '7', '10', '11', '12' and '13' in FIG. 23, an abnormal Iddq values are produced.

If attention is directed to the test vector numbers '7', '11' and '13', a similar input logic is set in each of the test vector numbers '3', '5' and '9'. However, there is produced no abnormality in the Iddq value in the input logic of these test vector numbers '3', '5' and '9'. The reason is that the DF/F is of a circuit structure in which data is transiently stored in the circuit in synchronism with a clock signal and outputted with the next clock signal.

Specifically, as will become clear from the truth value table of FIG. 23, the logic state held in the test vector numbers '7', '11' and '13' is such that the NOR circuit NOR1 of the Q output side and the NOR circuit NOR2 of the Q* output side are "H" and "L", respectively, while the logic state held in the test vector numbers '3', '5' and '9' is such that the NOR circuit NOR1 of the Q output side and the NOR circuit NOR2 of the Q* output side are "L" and "H", respectively. Therefore, if the NOR gate NOR1 of the Q output side goes high "H", the state of occurrence of abnormal Iddq value is detected as being abnormal by the holding states of the test vector numbers '7', '11' and '13'. That is, defect points in the sequential circuit need to be checked based on the logic setting on the DF/F and input logics of the holding states as a sole combination group test vector numbers [6, 7] and [10, 11, 12, 13]. That is, in detecting the defect points in the sequential circuit, decision as to whether or not a defect exists in a block cannot be given unless whether or not a group of combinations with previous input logics is present in the input logics of the normal test vector.

Figure 24:
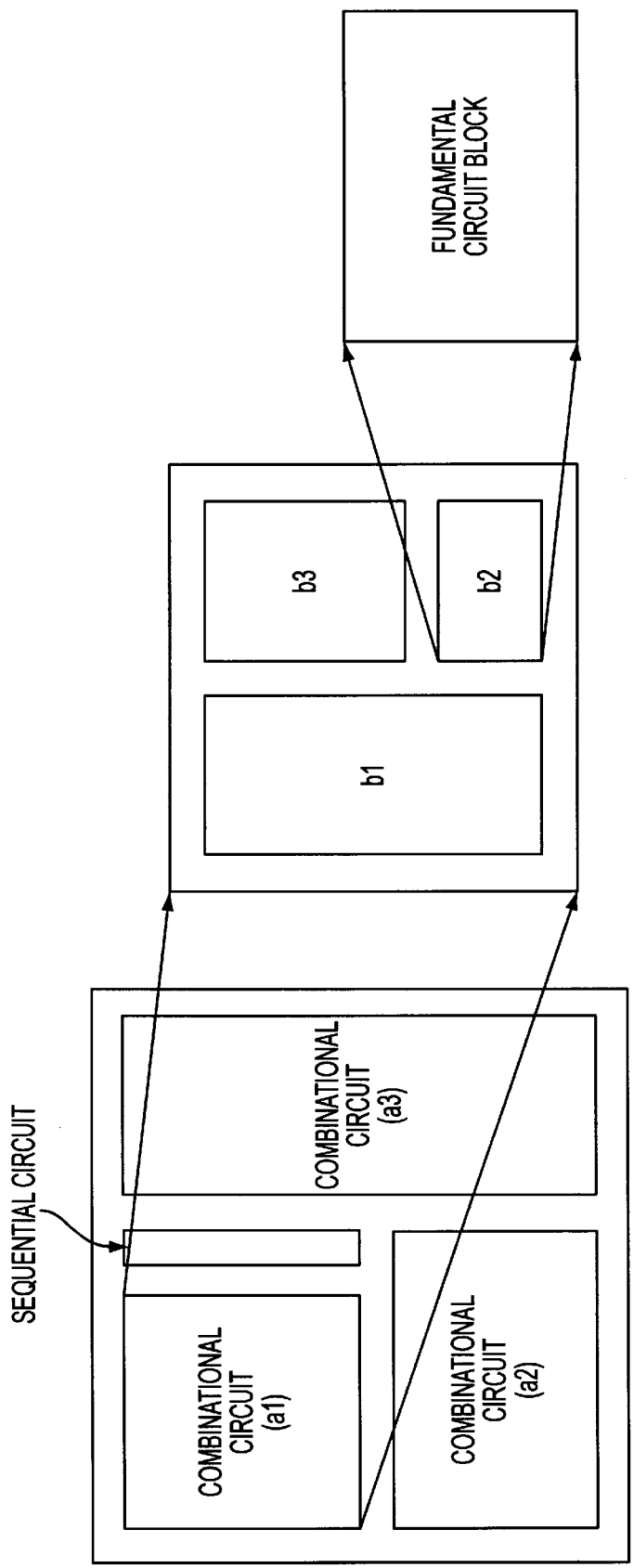
FIG. 24 illustrates a method for localizing a defect block by hierarchical division of LSI.

FIG. 24 shows a method for localizing a faulty block by hierarchical classification. With the hierarchical block structure, a method consisting in diagnosis in terms of a pre-set block arranged as a fundamental circuit termed a library used during deigning is customary. In a large-scale LSI, the number of blocks is thought to be enormous. Thus it is necessary to re-divide the inside of the LSI to modify the block structure in the inside of the LSI. Noteworthy in such re-structuring is the fact that the combination circuit and the sequential circuit in a hierarchical unit need to be distinguished in order to divide the inside of the LSI into hierarchical layers since the combination circuit and the sequential circuit need different processing operations.

Since the combination circuits and the sequential circuit exist together in an upper hierarchical layer in FIG. 24, the combination circuit is designed as a layered structure (a1, a2, a3) with the sequential circuit being treated as a boundary, for localizing defect points.

Then, in the hierarchical block a1, extracted as containing a defect, the defect point is localized in the layered hierarchical structure (b1, b2, b3) including the layered block a1 for locating defect point. Finally, a block as a "fundamental circuit structure" as a minimum unit is ultimately extracted.

However, if the combination circuit and the sequential circuit still exist together in a re-structured hierarchical block, the same processing operations as those for the sequential circuit can be executed for the block having the combination circuit(s) and the sequential circuit existing together for localizing the defect point.

The defective transistor extractor (extraction module) 3 will be now explained. The defective transistor extractor 3 localizes the transistor-level defect point of the faulty block extracted by the faulty block extractor 2. Each block is a functional circuit constituted by fundamental logical units, such as OR, NOR, NAND, AND, inverter or flipflop, as units, constituted in turn by several to tens of transistors. The method for localizing the defect points is the same for both the combination circuit and the sequential circuit. Since these basic logical circuits can be clearly judged as to which transistor is turned on or off in synchronism with the input logic, the defective transistor can be extracted easily by logical simulation. A two-input NAND circuit, as a fundamental logic circuit, is taken as an example for explanation.

Figures 25, 26:
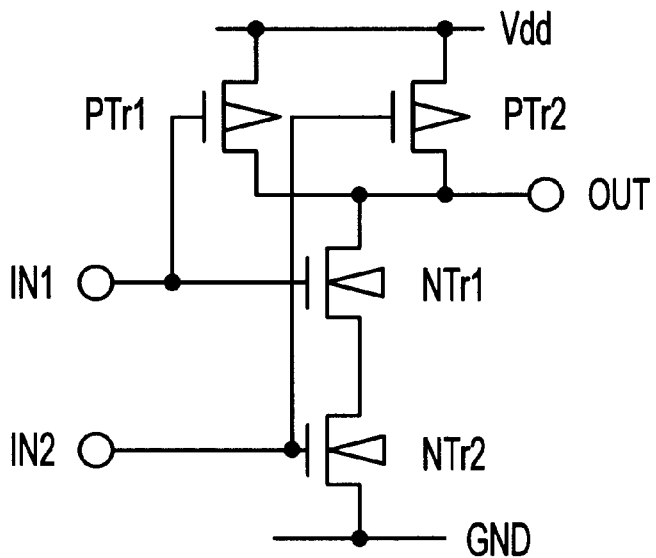
FIG. 25 is a circuit diagram for localizing a transistor-level defect point.
FIG. 26 is a truth table of the circuit shown in FIG. 25.
Figure 27:
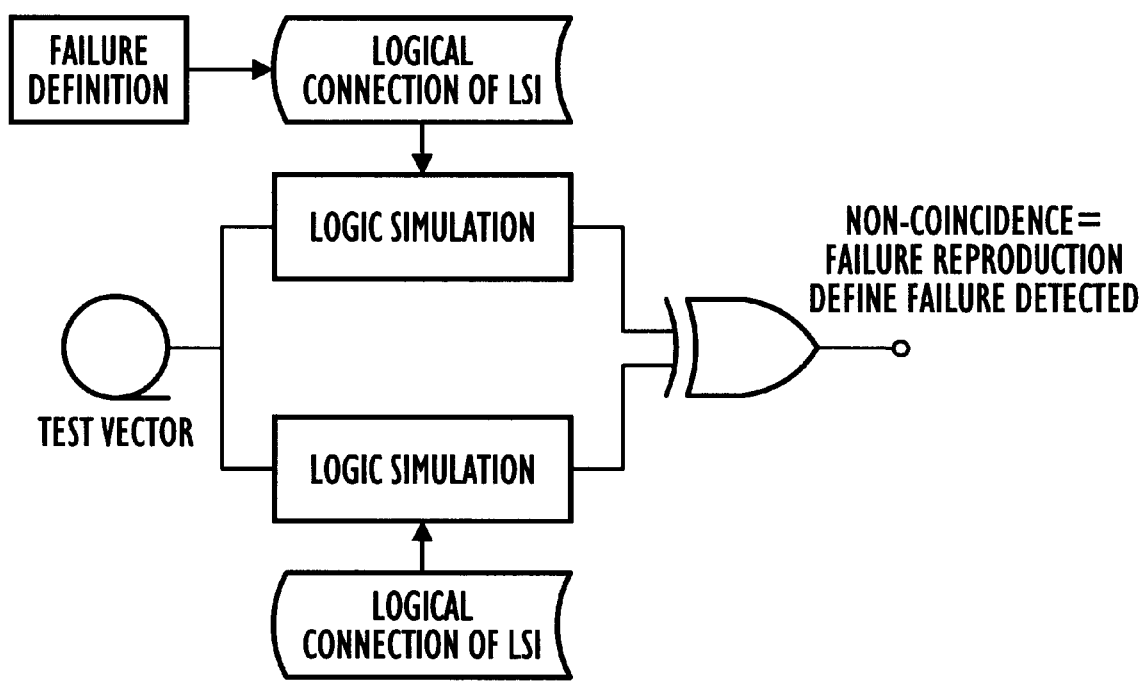
FIG. 27 illustrates a defect simulation system by failure dictionary.
Figure 28:
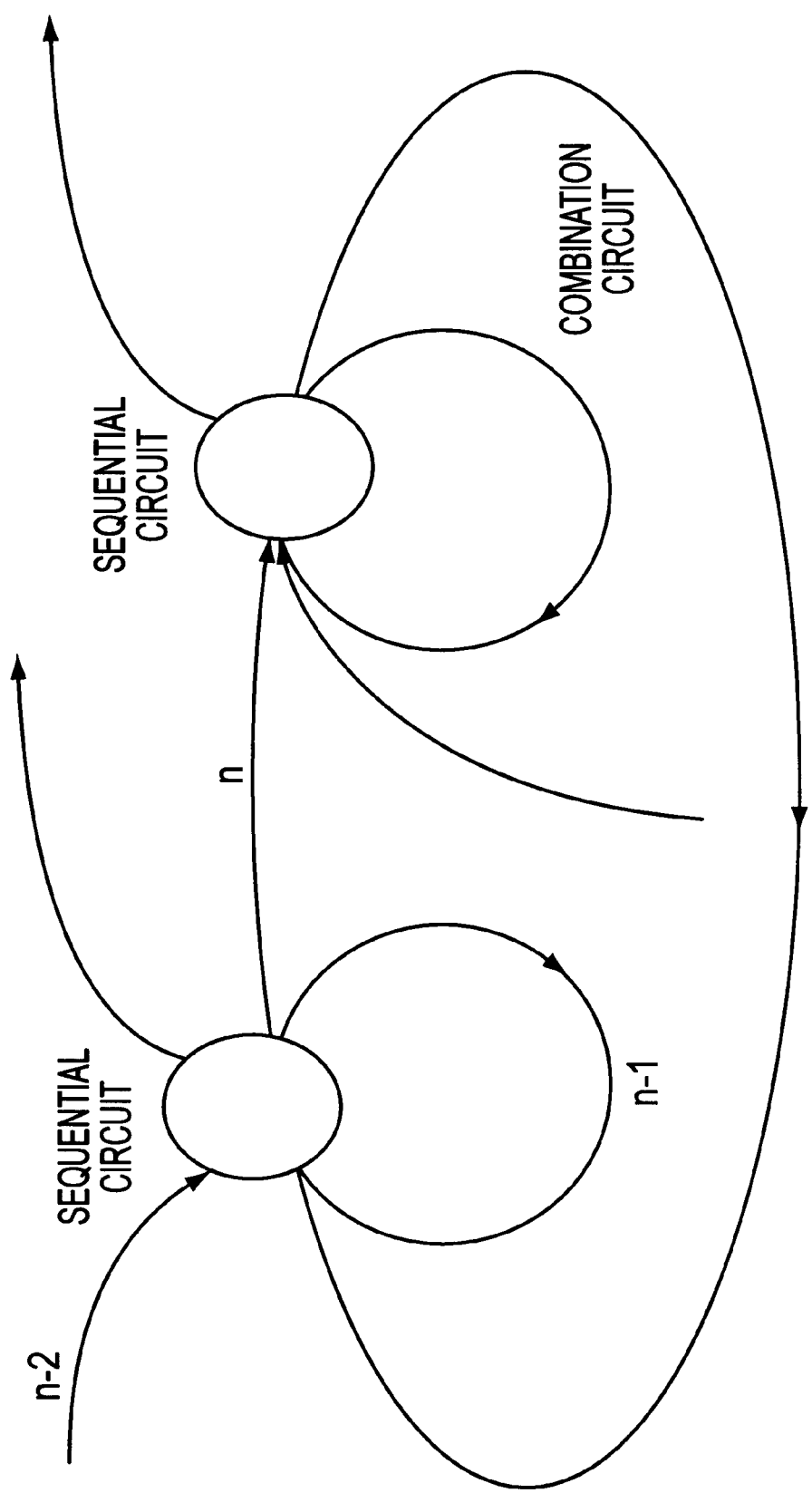
FIG. 28 illustrates the manner of feedback of a signal entering a sequential circuit.

FIG. 25 shows a two-input NAND circuit diagram, and FIG. 26 shows a correlation table between the Iddq value and the truth table with attention directed to all combinations of the input logics. Now assume that, of the combination of four input logics (TV1, TV2, TV3, TV4) constituted by two inputs, an Iddq value becomes abnormal for TV3, where a low level and a high level are entered to an input terminal IN1 and to an input terminal IN2, respectively, while combinations of the remaining input logics (TV1, TV2, TV4) are normal. The method for extracting the defective transistor based on this information will be now explained. Usually, this method for extracting the defective transistors is carried out by verifying which transistor is on/off by each test vector using the logic simulation.

In the two-input NAND circuit diagram of FIG. 25, the on/off states of P-channel transistors 1, 2 (depicted as PTr1, PTr2, respectively) and N-channel transistors 1, 2 (depicted as NTr1, NTr2, respectively) for the test vectors (TV1, TV2, TV3, TV4) are as follows:

| TVn0 | PTr1 | PTr2 | NTr1 | NTr2 | Iddq Values |
|------|------|------|------|------|-------------|
| TV1  | off  | off  | on   | on   | normal      |
| TV2  | off  | on   | on   | off  | normal      |
| TV3  | on   | off  | off  | on   | abnormal    |
| TV4  | on   | on   | off  | off  | normal      |

The following two paths of occurrence of the abnormal Iddq values may be thought of in the two-input NAND circuit:

A. Vdd→PTr1→NTr1→NTr2→GND
B. Vdd→PTr2→NTr1→NTr2→GND

If, based on these paths and the verification of the on/off states of the transistors, the paths of occurrence of the abnormal Iddq values are represented by the on/off states of the transistors, the path A is:

| A Vdd → PTr1 → NTr1 → NTr2 → GND | | | | |
|------|------|------|------|------|
| TV1  | off  | on   | on   | normal   |
| TV2  | off  | on   | off  | normal   |
| TV3  | on   | off  | on   | abnormal |
| TV4  | on   | off  | off  | normal   |

Therefore, a penetration current flows when NTr1 becomes abnormal and on at all times.

On the other hand, the path B in which occurs the abnormal Iddq value is:

| B Vdd → PTr2 → NTr1 → NTr2 → GND | | | | |
|------|------|------|------|------|
| TV1  | off  | on   | on   | normal   |
| TV2  | on   | on   | off  | normal   |
| TV3  | off  | off  | on   | abnormal |
| TV4  | on   | off  | off  | normal   |

Therefore, the penetration current flows when the PTr2 and NTr1 become abnormal and on at all times. However, since TV1 has a normal Iddq value and in conflict with the fact that PTr2 would contain a physical defect, resulting in that PTr2 is judged to be normal.

Thus it is apparent from verification of the paths A and B that the penetration current flows when NTr1 is abnormal and in the on state at all times.

The above is an example of the two-input NAND circuit constituted by four transistors. With the fundamental logical circuit constituted by tens of transistors, abnormal transistors can be extracted in a short time by carrying out the operation similar to the above verification by computer logic simulation.

Accordingly, the effect of the invention is summarized as follows:

Since the present invention localizes the defect points by exploiting the phenomenon of occurrence of abnormal Iddq values, the following merits are derived.

As a first effect the defect point can be identified even in cases wherein an abnormal state is not produced at an output terminal on impressing the test vector across the input terminal of the LSI.

As a second effect, the defect point can be localized easily. That is, the defect point can be localized if the test vector which has produced an abnormal Iddq value and the input logics of the blocks on entry of test vectors to the LSI are known even though the circuit structure of the LSI is not known, thus assuring facilitated localization of the defect point.

As a third effect, not only single degeneration (stuck-at state) but also multiple defects or open defects can be detected. If plural abnormal Iddq values are produced by multiple defects, the penetration currents flowing in the respective defect points are constant, so that it can be inferred how many defect points have occurred by simply reading out the Iddq values for the test vectors. Moreover, since arithmetic processing is possible for each defect point, the defect points can be identified even in case of multiple defects. Moreover, as for the open defects, becoming apparent as abnormal Iddq values, the logics of the defects generate the penetration current via the defect points, in addition, since the presence or absence of the abnormal Iddq value depends on the impressed test vector, it becomes possible to detect the open defects.

As a fourth effect, high-speed processing is possible. Since it suffices with the present invention only to execute arithmetic logic processing which the computer is good at thus assuring high-speed processing. Since the block-based operations are possible even though the LSI is of large scale, the effect of the computer capacity can be disregarded.

As a fifth effect, it can be judged easily whether or not defects are contained even in sequential circuits. That is, it can be judged whether or not defects are contained based on the test vector which produced abnormal Iddq values and on the input logic of each vector, while it is unnecessary to take account of the feedback loop.

As a sixth effect, the size of the Iddq value associated with abnormality has no relevance on locating the defect point. What is needed in locating the defect point is the information on which test vector the abnormal Iddq value has occurred, without relevance to the size of the Iddq value, so that defect points can be identified even in defective items where the difference of the Iddq value from that of the normal item is only small.

The computer-aided system may be made up of various modules as specified in the embodiment and naturally other modules and elements, devices, input/output means etc. (cummulatively termed as "hardware resources") which are generally known in the computer art, and such hardware resources are not illustrated in detail. However, a person skilled in the art can make use of such hardware resources without difficulty based on the teaching disclosed herein.

Also it is selfexplanatory that the specific steps and operations are controlled by a computer program oriented to this purpose and time to time recorded in a memory device associated with the system. The program can be recorded in a recording medium, too, separatable from the system. The system may comprise a control unit acting on the LSI tester module having connecting terminals with those of a LSI chip.

It is noted that modifications obvious in the art may be done without departing from the gist and scope of the present invention as herein disclosed and claimed as appended.

What is claimed is:

1. A method for identifying a failure point comprising:
   sequentially entering a plurality of test vectors across the input terminals of an LSI, containing at least one block, in a pre-set sequence to detect a test vector producing an abnormality in an Iddq value;
   finding, by logic simulation for each test vector, an input logic entered to each block of the LSI; and
   judging, for each block, whether or not a defect is contained in the block, by logic processing which is based on an input logic of the block determined by logic simulation for a test vector which produced an abnormality in the Iddq value and on an input logic of the block determined by logic simulation for a test vector which produced no abnormality in the Iddq.

2. The method for identifying a failure point as defined in claim 1 wherein, the block is judged as containing a defect if an input logic of the block which coincides with an input logic of the block determined by logic simulation for a test vector which produced an abnormality in the Iddq value is absent in an input logic of the block determined by logic simulation for a test vector which produced no abnormality in the Iddq value.

3. The method for identifying a failure point as defined in claim 1 wherein, the block is judged to contain a defect if plural contiguous test vectors in the test vectors sequentially entered across the input terminals of an LSI in a pre-set sequence produced abnormality in the Iddq value and a set of input logics for the block which conicide with the set of input logics determined by logic simulation for the contiguous test vectors which produced abnormality in the Iddq value is not present in the input logic determined by logic simulation for the contiguous test vectors which produce no abnormality in the Iddq value.

4. A method for identifying a failure point wherein, if a block is a combination circuit, it is checked whether a defect is contained therein by a method of claim 1 and, if a block is a sequential circuit, it is checked whether a defect is contained therein by a method of claim 3.

5. The method for identifying a failure point as defined in claim 1 wherein a failure point of a block containing a defect is localized on a transistor level.

6. The method for identifying a failure point as defined in claim 1 wherein, after identifying a block containing a defect for blocks of upper hierarchy, a block containing a defect is identified for blocks of lower hierarchy.

7. A method for identifying a failure point comprising:
   sequentially entering a plurality of test vectors across the input terminals of an LSI in a pre-set sequence to detect a test vector producing an abnormality in an Iddq value;
   inferring the number of defective blocks and finding, from defect to defect, which test vectors led to abnormalities in the Iddq value based on the test vectors which produced abnormalities in the Iddq values and the corresponding Iddq values;
   finding, by logic simulation for each test vector, the input logic entered to each block constituting the LSI; and
   judging, for each block, from defect to defect, whether or not a defect is contained in the block, by logic processing which is based on the input logic of the block determined by logic simulation for a test vector which produced an abnormality in the Iddq value and on the input logic of the block determined by logic simulation for a test vector which produced no abnormality in the Iddq value.

8. A system for identifying a failure point of LSI comprising:

an LSI tester module loading an LSI to be tested, a test vector filing memory module, a faulty block extracting module, and a defective transistor extracting module, wherein said faulty block extracting module carries out the following operations:

sequentially entering a plurality of test vectors across the input terminals of an LSI in a pre-set sequence to detect a test vector producing an abnormality in an Iddq value;

finding, by logic simulation for each test vector, an input logic entered to each block of the LSI; and judging, for each block, whether or not a defect is contained in the block, by logic processing which is based on an input logic of the block determined by logic simulation for a test vector which produced an abnormality in the Iddq value and on an input logic of the block determined by logic simulation for a test vector which produced no abnormality in the Iddq value.

9. A system for identifying a failure point of LSI comprising:

an LSI tester module loading an LSI to be tested, a test vector filing memory module, a faulty block extracting module, and a defective transistor extracting module, wherein said faulty block extracting module caries out the following operations:

sequentially entering a plurality of test vectors across the input terminals of an LSI in a pre-set sequence to detect a test vector producing an abnormality in an Iddq value;

inferring the number of defective blocks and finding, from defect to defect, which test vectors let to abnormalities in the Iddq value based on the test vectors which produced abnormalities in the Iddq values and the corresponding Iddq values;

finding, by logic simulation for each test vector, the input logic entered to each block constituting the LSI; and judging, for each block, from defect to defect, whether or not a defect is contained in the block, by logic processing which is based on the input logic of the block determined by logic simulation for a test vector which produced an abnormality in the Iddq value and on the input logic of the block determined by logic simulation for a test vector which produced no abnormality in the Iddq value.

\* \* \* \* \*

UNITED STATES PATENT AND TRADEMARK OFFICE
CERTIFICATE OF CORRECTION

PATENT NO. : 5,944,847
DATED : August 31, 1999
INVENTOR(S) : Masaru SANADA

It is certified that error appears in the above-identified patent and that said Letters Patent is hereby corrected as shown below:

Title page, item [73] Assignee: delete "Tokyo, Japan, Tokyo, Japan" and insert

--NEC Corporation, Tokyo, Japan--.

Signed and Sealed this

Twelfth Day of September, 2000

Attest:

Q. TODD DICKINSON

*Attesting Officer*      *Director of Patents and Trademarks*